United States Patent
Lee et al.

(10) Patent No.: US 11,908,867 B2
(45) Date of Patent: *Feb. 20, 2024

(54) SEMICONDUCTOR DEVICE AND METHOD FOR FABRICATING THE SAME

(71) Applicant: SAMSUNG ELECTRONICS CO., LTD., Suwon-si (KR)

(72) Inventors: Myoung-Sun Lee, Seoul (KR); Keun Hwi Cho, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/157,591

(22) Filed: Jan. 20, 2023

(65) Prior Publication Data

US 2023/0163131 A1    May 25, 2023

Related U.S. Application Data

(63) Continuation of application No. 16/789,588, filed on Feb. 13, 2020, now Pat. No. 11,563,004.

(30) Foreign Application Priority Data

Jul. 17, 2019 (KR) .................. 10-2019-0086088

(51) Int. Cl.
  *H01L 27/092*   (2006.01)
  *H01L 27/02*    (2006.01)
  (Continued)

(52) U.S. Cl.
  CPC ...... *H01L 27/0924* (2013.01); *H01L 27/0207* (2013.01); *H01L 21/02529* (2013.01);
  (Continued)

(58) Field of Classification Search
  CPC ......... H01L 21/02529; H01L 21/02532; H01L 21/823431; H01L 21/823473;
  (Continued)

(56) References Cited

U.S. PATENT DOCUMENTS 7,888,750 B2   2/2011 Anderson et al.
8,766,364 B2   7/2014 Doornbos et al.
(Continued)

*Primary Examiner* — David C Spalla
(74) *Attorney, Agent, or Firm* — Sughrue Mion, PLLC

(57) ABSTRACT

There is provided a semiconductor device having enhanced operation performance by utilizing a cut region where a gate cut is implemented. There is provided a semiconductor device comprising a first active pattern, a second active pattern, a third active pattern, and a fourth active pattern, all of which extend in parallel in a first direction, and are arranged along a second direction intersecting the first direction; a first gate electrode extended in the second direction on the first to fourth active patterns a first cut region extended in the first direction between the first active pattern and the second active pattern to cut the first gate electrode and a second cut region extended in the first direction between the third active pattern and the fourth active pattern to cut the first gate electrode, wherein one or more first dimensional features related to the first cut region is different from one or more second dimensional features related to the second cut region.

20 Claims, 30 Drawing Sheets

(51) Int. Cl.
*H01L 21/8238* (2006.01)
*H01L 29/08* (2006.01)
*H01L 29/78* (2006.01)
*H01L 29/165* (2006.01)
*H01L 21/02* (2006.01)
*H01L 29/417* (2006.01)

(52) U.S. Cl.
CPC .................. *H01L 21/02532* (2013.01); *H01L 21/823814* (2013.01); *H01L 29/0847* (2013.01); *H01L 29/165* (2013.01); *H01L 29/41783* (2013.01); *H01L 29/7848* (2013.01)

(58) Field of Classification Search
CPC ..... H01L 21/823456; H01L 21/823814; H01L 21/823821; H01L 21/823828; H01L 21/845; H01L 27/0207; H01L 27/0886; H01L 27/0924; H01L 27/1211; H01L 29/0847; H01L 29/165; H01L 29/41783; H01L 29/41791; H01L 29/66795; H01L 29/7848; H01L 29/785; H01L 29/7851; H01L 29/7853; H01L 29/7855; H01L 2029/7858

See application file for complete search history.

(56) References Cited

U.S. PATENT DOCUMENTS

| | | | |
|---|---|---|---|
| 9,537,007 | B2 | 1/2017 | Yang et al. |
| 9,607,988 | B2 | 3/2017 | Liu et al. |
| 9,853,112 | B2 | 12/2017 | Liu et al. |
| 10,014,409 | B1 | 7/2018 | Wu et al. |
| 10,020,398 | B1 | 7/2018 | Cheng et al. |
| 10,103,172 | B2 | 10/2018 | Agarwal et al. |
| 10,236,302 | B2 | 3/2019 | Correale, Jr. et al. |
| 10,741,401 | B1 | 8/2020 | Xu et al. |
| 11,563,004 | B2 * | 1/2023 | Lee ................ H01L 21/823431 |
| 2017/0256458 | A1 | 9/2017 | Chang et al. |
| 2017/0345935 | A1 | 11/2017 | Morin |
| 2017/0358565 | A1 | 12/2017 | Hensel et al. |
| 2018/0301557 | A1 | 10/2018 | Cheng et al. |
| 2019/0067115 | A1 | 2/2019 | Park et al. |

* cited by examiner

SEMICONDUCTOR DEVICE AND METHOD FOR FABRICATING THE SAME

This application is a Continuation of U.S. application Ser. No. 16/789,588, filed on Feb. 13, 2020, which is based on and claims priority under 35 U.S.C. § 119 from Korean Patent Application No. 10-2019-0086088 filed on Jul. 17, 2019 in the Korean Intellectual Property Office, the contents of which in its entirety are herein incorporated by reference.

BACKGROUND

1. Field

The disclosure relates to a semiconductor device and a method for fabricating the same. More particularly, the disclosure relates to a semiconductor device having a gate cut implemented therein, and a method for fabricating the same.

2. Description of the Related Art

Recently, in order to enhance integrated circuit device density, a multi-gate transistor has been suggested as one of the scaling technologies, in which a silicon body in a fin-like shape or a nanowire-like shape is formed on a substrate, with gates then being formed on the surface of the silicon body.

Such a multi-gate transistor allows easy scaling, as it uses a three-dimensional channel. Also, current control capability can be enhanced without requiring increased gate length of the multi-gate transistor. Moreover, it is possible to effectively inhibit the short channel effect (SCE), where the electric potential of a channel region is affected by a drain voltage.

SUMMARY

The disclosure provides a semiconductor device having enhanced operation performance by utilizing a cut region where a gate cut is implemented, and method for manufacturing the same.

According to an aspect of the disclosure, there is provided a semiconductor device comprising: a first active pattern, a second active pattern, a third active pattern, and a fourth active pattern, all of which extend in parallel in a first direction, and are arranged along a second direction intersecting the first direction; a first gate electrode provided on the first to fourth active patterns and extending in the second direction; a first cut region that extends in the first direction between the first active pattern and the second active pattern to cut the first gate electrode; and a second cut region that extends in the first direction between the third active pattern and the fourth active pattern to cut the first gate electrode, wherein one or more first dimensional features related to the first cut region is different from one or more second dimensional features related to the second cut region.

According to another aspect of the disclosure, there is provided a semiconductor device comprising: a first active pattern, a second active pattern, and a third active pattern, all of which extend in parallel in a first direction, and are arranged along a second direction intersecting the first direction; a first gate electrode provided on the first to third active patterns and extending in the second direction; a second gate electrode extended in the second direction adjacent to the first gate electrode on the first to third active patterns; a first cut region that extends in the first direction between the first active pattern and the second active pattern to cut the first gate electrode; and a second cut region that extends in the first direction between the second active pattern and the third active pattern to cut the second gate electrode, and not to cut the first gate electrode, wherein one or more first dimensional features related to the first cut region is different from one or more second dimensional features related to the second cut region.

According to an aspect of the disclosure, there is provided a semiconductor device, comprising: a substrate comprising an NFET region and a PFET region; a first active pattern provided on the NFET region and extending in a first direction; a second active pattern provided on the PFET region and extending in the first direction; a first gate electrode provided on the first and second active patterns and extending in a second direction intersecting the first direction; a first cut region provided on a first side surface of the first active pattern opposite to the second active pattern and extending in the first direction to cut the first gate electrode; and a second cut region provided on a second side surface of the second active pattern opposite to the first active pattern and extending in the first direction to cut the first gate electrode, wherein one or more first dimensional features related to the first cut region is different from one or more second dimensional features related to the second cut region.

According to another aspect of the disclosure, there is provided a semiconductor device comprising: a first active pattern, a second active pattern, a third active pattern, and a fourth active pattern, all of which extend in parallel in a first direction, and are arranged along a second direction intersecting the first direction; a first gate electrode extended in the second direction on the first to fourth active patterns, a second gate electrode extended in the second direction adjacent to the first gate electrode on the first to fourth active patterns, and a first cut region extended in the first direction between the first active pattern and the second active pattern to cut the first gate electrode, and a second cut region extended in the first direction between the third active pattern and the fourth active pattern to cut the first gate electrode, a third cut region extended in the first direction between the second active pattern and the third active pattern to cut the second gate electrode, and not to cut the first gate electrode, wherein a distance between the second active pattern and the third cut region is different from a distance between the third active pattern and the third cut region.

The technical objectives that are intended to be addressed by the disclosure are not limited to that mentioned above, and other technical objectives that are not mentioned above can be clearly understood to those skilled in the art based on the description provided below.

DETAILED DESCRIPTION

Hereinbelow, semiconductor devices according to some exemplary embodiments of the disclosure will be described with reference to FIGS. 1 to 19B.

Although the drawings may illustrate that a semiconductor device formed on a substrate is a fin-type transistor (FinFET) according to an exemplary embodiment, the disclosure is not limited hereto. For example, in the semiconductor device according to some exemplary embodiments, a semiconductor element formed on the substrate may include a buried channel array transistor (BCAT), a recess channel array transistor (RCAT), a tunneling transistor (tunneling FET), a transistor including a nanowire, a transistor including a nanosheet, or a vertical transistor (vertical FET).

Figure 1:
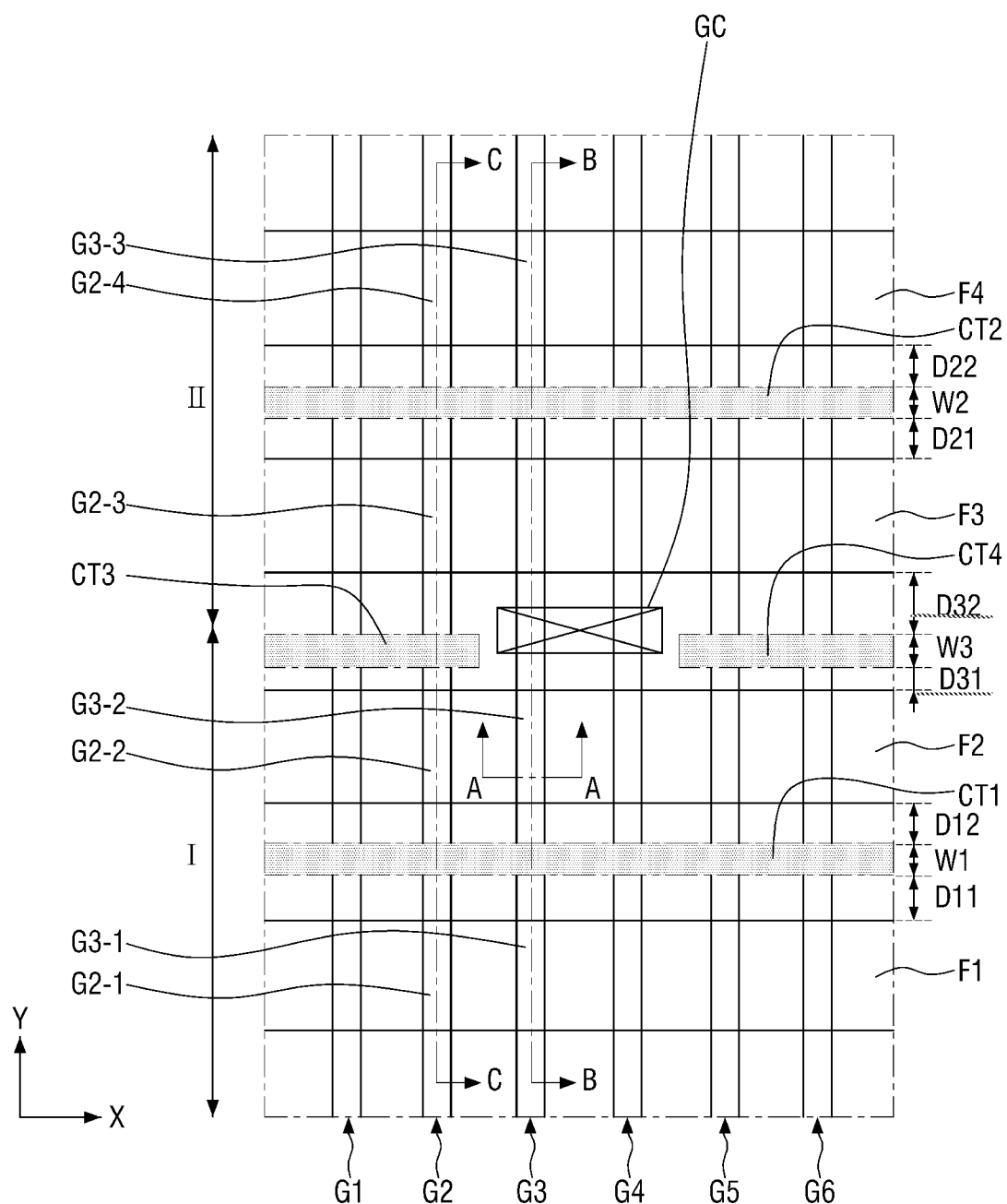
FIG. 1 is a layout view provided to explain a semiconductor device according to an exemplary embodiment.
Figure 2:
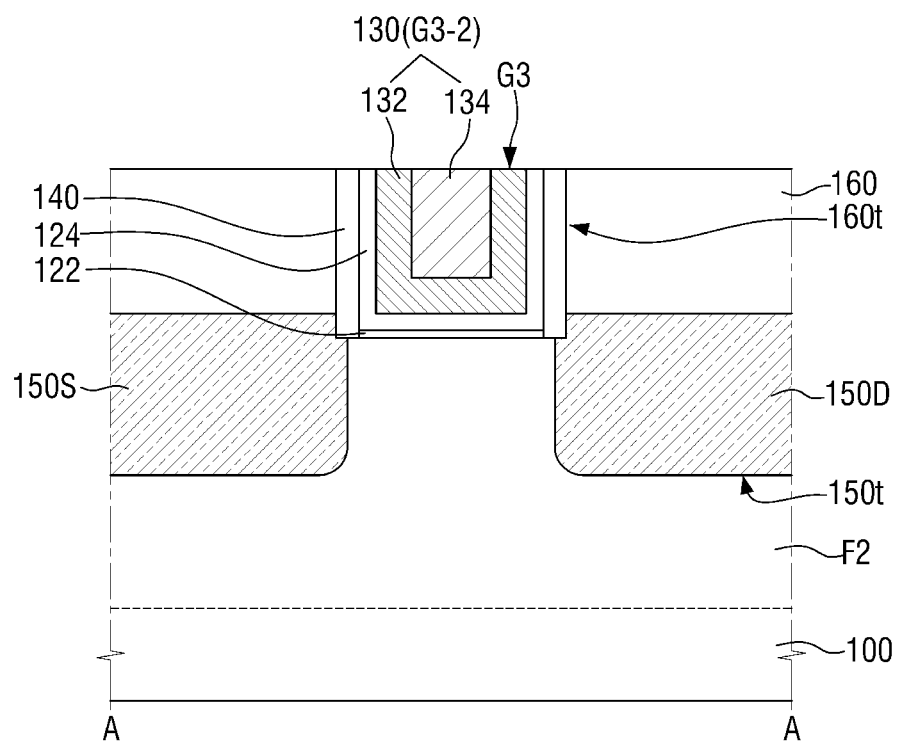
FIG. 2 is a cross-sectional view taken on line A-A of FIG. 1.
Figure 3:
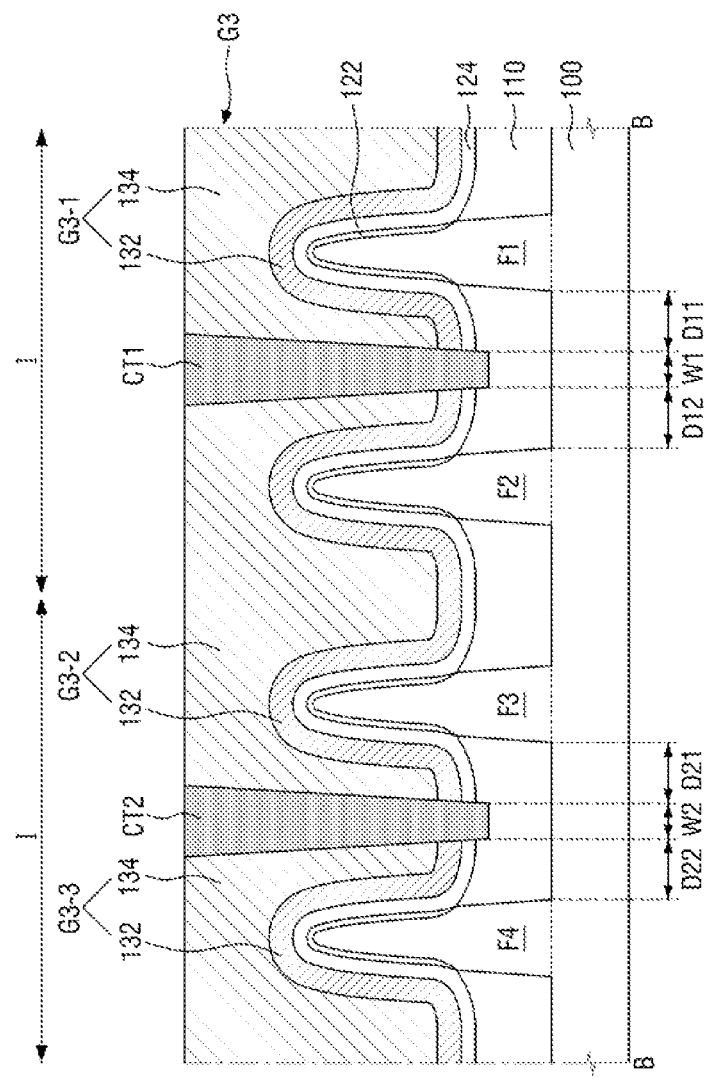
FIG. 3 is a cross sectional view taken on line B-B of FIG. 1.
Figure 4:
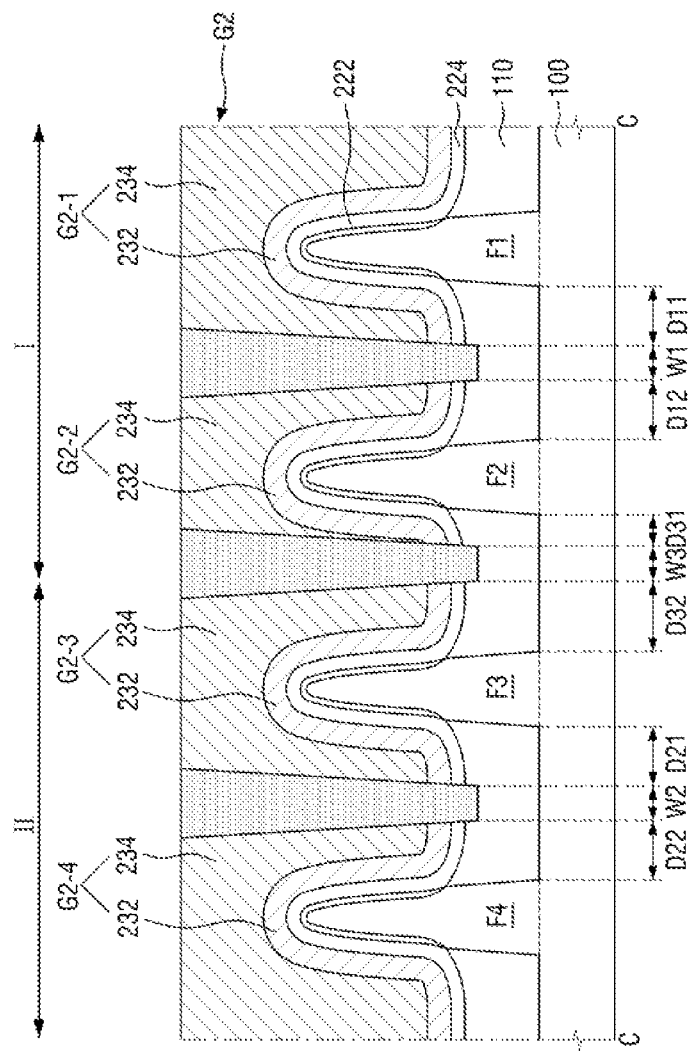
FIG. 4 is a cross-sectional view taken on line C-C of FIG. 1.

FIG. 1 is a layout view provided to explain a semiconductor device according to an exemplary embodiment. FIG. 2 is a cross-sectional view taken on line A-A of FIG. 1. FIG. 3 is a cross sectional view taken on line B-B of FIG. 1. FIG. 4 is a cross-sectional view taken on line C-C of FIG. 1. For convenience of explanation, a gate contact GC, which is illustrated in FIG. 1, is not illustrated in FIGS. 2 to 4.

Referring to FIGS. 1 to 4, the semiconductor device according to an exemplary embodiment includes a substrate 100, first to fourth active patterns F1-F4, a field insulating film 110, first to sixth gate electrodes G1-G6, first to fourth cut regions CT1-CT4, a gate spacer 140, a gate dielectric films 124, 244, a source region 150S and a drain region 150D, and an interlayer insulating film 160.

The substrate 100 may be, for example, a bulk silicon or a silicon-on-insulator (SOI). For example, the substrate 100 may be a silicon substrate, or may include other material such as silicon germanium, indium antimonide, lead telluride compound, indium arsenide, indium phosphide, gallium arsenide, or gallium antimonide. Alternatively, the substrate 100 may be a base substrate having an epitaxial layer formed thereon. In the following description, it is assumed that the substrate 100 is a silicon substrate by way of an example.

The substrate 100 may include a first region I and a second region II. The first region I and the second region II may be regions spaced apart from each other, or regions adjacent to each other. Transistors of different conductive types may be formed on the first region I and the second region II, or transistors of the same conductive type may be formed thereon.

The first to fourth active patterns F1-F4 may protrude from an upper surface of the substrate 100 and be extended longitudinally. For example, each of the first to fourth active patterns F1-F4 may have a short side and a long side. It is illustrated in FIG. 1 that the long sides of the first to fourth active patterns F1-F4 are extended in a first direction X. That is, each of the first to fourth active patterns F1-F4 may be extended longitudinally in the first direction X.

The first to fourth active patterns F1-F4 may be spaced apart from one another and may be extended in parallel. For example, the first to fourth active patterns F1-F4 may be arranged in sequence along a second direction Y that intersects the first direction X. As shown in FIG. 1, the first to fourth active patterns F1-F4 may be spaced apart from one another by an equal distance, but the disclosure is not limited hereto.

In some exemplary embodiments, the first and second active patterns F1, F2 may be arranged on the first region I of the substrate 100, and the third and fourth active patterns F3, F4 may be arranged on the second region II of the substrate 100. For example, the first region I of the substrate 100 and the second region II of the substrate 100 may be arranged along the second direction Y.

In some exemplary embodiments, transistors of different conductive types may be formed on the first region I and the second region II. Hereinbelow, it will be explained herein that the first region I is an NFET region and the second region II is an PFET region. However, this is merely an example, and the first region I may be a PFET region and the second region II may be an NFET region. When the first region I is the NFET region, the first and second active patterns F1, F2 may include a p-type impurity. When the second region II is the PFET region, the third and fourth active patterns F3, F4 may include an n-type impurity.

The first to fourth active patterns F1-F4 may be a part of the substrate 100, and may include an epitaxial layer grown from the substrate 100. The first to fourth active patterns F1-F4 may include, for example, an elemental semiconductor material such as silicon or germanium. Further, the first to fourth active patterns F1-F4 may include a compound semiconductor such as IV-IV group compound semiconductor or III-V group compound semiconductor, for example.

The field insulating film 110 may be formed on the substrate 100. In some exemplary embodiments, the field insulating film 110 may surround a part of side surfaces of the first to fourth active patterns F1-F4. For example, as shown in FIGS. 3 and 4, the first to fourth active patterns F1-F4 may further protrude upwardly above the field insulating film 110. For example, an upper surface of the first to fourth active patterns may be above an upper surface of the field insulating film.

The field insulating film 110 may include, for example, at least one of silicon oxide ($SiO_2$), silicon nitride (SiN), silicon oxynitride (SiON), silicon oxycarbonitride (SiOCN), or a combination thereof, but the disclosure is not limited hereto.

The first to sixth gate electrodes G1-G6 may be formed on the first to fourth active patterns F1-F4. The first to sixth gate electrodes G1-G6 may be extended in a direction that intersects the first to fourth active patterns F1-F4. For example, each of the first to sixth gate electrodes G1-G6 may be extended longitudinally in the second direction Y. In some exemplary embodiments, the first to sixth gate electrodes G1-G6 may be extended across the first region I and the second region II.

The first to sixth gate electrodes G1-G6 may be spaced apart from one another and may be extended in parallel. For example, the first to sixth gate electrodes G1-G6 may be arranged in sequence along the first direction X. As shown in FIG. 1, the first to sixth gate electrodes G1-G6 may be spaced apart from one another by an equal distance, but the disclosure is not limited hereto.

In some exemplary embodiments, each of the first to sixth gate electrodes G1-G6 may be formed with a plurality of conductive materials stacked on one another. For example, as shown in FIGS. 2 to 4, each of the first to sixth gate electrodes G1-G6 may include a work function adjustment film 132 to adjust a work function, and a filling conductive film 134 filling a space formed by the work function adjustment film 132.

The work function adjustment film 132 may include, for example, at least one of TiN, TaN, TiC, TaC, TiAlC, and a combination thereof, but the present inventive concept is not limited hereto. The filling conductive film 134 may include, for example, W or Al, but the disclosure is not limited hereto.

For example, the first to sixth gate electrodes G1-G6 may be formed by a replacement process, but the disclosure is not limited hereto.

The first to fourth cut regions CT1-CT4 may cut the first to sixth gate electrodes G1-G6. That is, according to an exemplary embodiment, the first to fourth cut regions CT1-CT4 may physically separate at least one of the first to sixth gate electrodes G1-G6. For example, as shown in FIG. 1, the first to fourth cut regions CT1-CT4 may be extended in the first direction X to cut at least part of the first to sixth gate electrodes G1-G6.

The first to fourth cut regions CT1-CT4 may have insulting patterns formed therein. For example, the first to fourth cut regions CT1-CT4 may include at least one of silicon nitride (SiN), silicon oxynitride (SiON), silicon oxide (SiO$_2$), silicon oxycarbonitride (SiOCN), or a combination thereof, but the disclosure is not limited hereto. Accordingly, the first to fourth cut regions CT1-CT4 may electrically disconnect or separate the first to sixth gate electrodes G1-G6.

Although FIG. 1 only illustrates insulating patterns integrally formed in the first to fourth cut regions CT1-CT4, the disclosure is not limited hereto. The insulating patterns may be discontinuously formed in the first to fourth cut regions CT1-CT4 as long as they can cut the first to sixth gate electrodes G1-G6.

In some exemplary embodiments, the first to fourth cut regions CT1-CT4 may be formed on the same level. Herein, the term, "same level," refers to being formed by the same fabricating process. For example, the first to fourth cut regions CT1-CT4 may include the same material.

The first cut region CT1 may be formed on the first region I of the substrate 100. The first cut region CT1 may be formed on a side surface of the second active pattern F2 opposite to the third active pattern F3. For example, the first cut region CT1 may be interposed between the first active pattern F1 and the second active pattern F2.

In some exemplary embodiments, the first cut region CT1 may be extended in the first direction X to cut the first to sixth gate electrodes G1-G6. For example, the second gate electrode G2 may include a first portion G2-1 and a second portion G2-2 which are electrically disconnected by the first cut region CT1. In addition, for example, the third gate electrode G3 may include a first portion G3-1 and a second portion G3-2 which are electrically disconnected by the first cut region CT1.

In some exemplary embodiments, a distance D11 between the first active pattern F1 and the first cut region CT1 may be the same as a distance D12 between the second active pattern F2 and the first cut region CT1. In the detailed description, the term "same" refers to not only being exactly the same but also includes a minute difference or variations that may be caused by a margin or the like in a process.

The second cut region CT2 may be formed on the second region II of the substrate 100. The second cut region CT2 may be formed on a side surface of the third active pattern F3 opposite to the second active pattern F2. For example, the second cut region CT2 may be interposed between the third active pattern F3 and the fourth active pattern F4.

In some exemplary embodiments, the second cut region CT2 may be extended in the first direction X to cut the first to sixth gate electrodes G1-G6. For example, the second gate electrode G2 may include a third portion G2-3 and a fourth portion G2-4 which are electrically disconnected by the second cut region CT2. In addition, for example, the third gate electrode G3 may include the second portion G3-2 and a third portion G3-3 which are electrically disconnected by the second cut region CT2.

In some exemplary embodiments, a distance D21 between the third active pattern F3 and the second cut region CT2 may be the same as a distance D22 between the fourth active pattern F4 and the second cut region CT2. In addition, in some exemplary embodiments, the distance D21 between the third active pattern F3 and the second cut region CT2 may be the same as the distance D12 between the second active pattern F2 and the first cut region CT1.

In some exemplary embodiments, a width W2 of the second cut region CT2 may be the same as a width W1 of the first cut region CT1. Herein, the term "width" refers to a width in the second direction Y. According to an exemplary embodiment, the width W2 of the second cut region CT2 and the width W1 of the first cut region CT1 are measured at the same corresponding position at the second cut region CT2 and the first cut region CT1. For instance, according to an embodiment, the width W2 may be a width measured at the lower most portion of the second cut region CT2 and the width W1 may be a width measured at the lower most portion of the first cut region CT1. According to another embodiment, the width W2 may be a width measured at the upper most portion of the second cut region CT2 and the width W1 may be a width measured at the upper most portion of the first cut region CT1. According to yet another embodiment, the width W2 may be a width measured at the center portion of the second cut region CT2 and the width W1 may be a width measured at the center portion of the first cut region CT1.

The third and fourth cut regions CT3, CT4 may be formed on a side surface of the second active pattern F2 facing the third active pattern F3. In addition, the third and fourth cut regions CT3, CT4 may be formed on a side surface of the third active pattern F3 facing the second active pattern F2. For example, the third and fourth cut regions CT3, CT4 may be interposed between the second active pattern F2 and the third active pattern F3.

In some exemplary embodiments, the third and fourth cut regions CT3, CT4 may be extended in the first direction X to cut the first, second, fifth, and sixth gate electrodes G1, G2, G5, G6. For example, the third cut region CT3 may be extended in the first direction X to cut the first and second gate electrodes G1, G2, and the fourth cut region CT4 may be extended in the first direction X to cut the fifth and sixth gate electrodes G5, G6. For example, the second gate electrode G2 may include the second portion G2-2 and the third portion G2-3 which are electrically disconnected by the third cut region CT3.

However, in some exemplary embodiments, the third and fourth cut regions CT3, CT4 may not cut the third and fourth gate electrodes G3, G4. For example, the second portion G3-2 of the third gate electrode G3 may not be cut by the third cut region CT3. Accordingly, the second portion G3-2 of the third gate electrode G3 may be shared by the second and third active patterns F2, F3.

In some exemplary embodiments, the third and fourth gate electrodes G3, G4 may be active gate electrodes. For example, the second portion G3-2 of the third gate electrode G3 may be connected with a gate contact GC applying a gate voltage. Accordingly, the second portion G3-2 of the third gate electrode G3 may function as a gate of a transistor including the second active pattern F2 and a transistor including the third active pattern F3.

In some exemplary embodiments, the first, second, fifth, and sixth gate electrodes G1, G2, G5, G6 may be dummy gate electrodes. For example, the second portion G2-2 and the third portion G2-3 of the second gate electrode G2 may not be connected with the gate contact GC applying the gate voltage. Accordingly, the second portion G2-2 of the second gate electrode G2 may not function as the gate of the transistor including the second active pattern F2. Likewise, the third portion G2-3 of the second gate electrode G2 may not function as the gate of the transistor including the third active pattern F3.

In some exemplary embodiments, a distance D31 between the second active pattern F2 and the third and fourth cut regions CT3, CT4 may be different from a distance D32 between the third active pattern F3 and the third and fourth cut regions CT3, CT4. For example, as shown in FIGS. 1 and 4, the distance D31 between the second active pattern F2 and the third and fourth cut regions CT3, CT4 may be shorter than the distance D32 between the third active pattern F3 and the third and fourth cut regions CT3, CT4. In this case, operation performance of the transistor including the second active pattern F2, which is the NFET region, can be enhanced. This will be described in detail in the explanation of FIGS. 5A and 5B.

In some exemplary embodiments, the distance D31 between the second active pattern F2 and the third and fourth cut regions CT3, CT4 may be different from the distance D12 between the second active pattern F2 and the first cut region CT1. For example, as shown in FIGS. 1 and 4, the distance D31 between the second active pattern F2 and the third and fourth cut regions CT3, CT4 may be shorter than the distance D12 between the second active pattern F2 and the first cut region CT1.

In some exemplary embodiments, the distance D32 between the third active pattern F3 and the third and fourth cut regions CT3, CT4 may be different from the distance D21 between the third active pattern F3 and the third and fourth cut regions CT3, CT4. For example, as shown in FIGS. 1 and 4, the distance D32 between the third active pattern F3 and the third and fourth cut regions CT3, CT4 may be longer than the distance D21 between the third active pattern F3 and the third and fourth cut regions CT3, CT4.

In some exemplary embodiments, a width W3 of the third cut region CT3 may be the same as the width W1 of the first cut region CT1 and the width W2 of the second cut region CT2.

The gate spacer 140 may be formed on both side surfaces of each of the first to sixth gate electrodes G1-G6. For example, as shown in FIG. 2, the gate spacer 140 may be extended along both side surfaces of the third gate electrode G3. In addition, the gate spacer 140 may be extended longitudinally in the second direction Y.

The gate spacer 140 may include, for example, at least one of silicon nitride (SiN), silicon oxynitride (SiON), silicon oxide (SiO$_2$), silicon oxycarbonitride (SiOCN), or a combination thereof, but the disclosure is not limited hereto.

According to an exemplary embodiment, the gate dielectric film 124, 224 may be interposed between each of the first to fourth active patterns F1-F4 and each of the first to sixth gate electrodes G1-G6. For example, as shown in FIGS. 2 and 3, the first gate dielectric film 124 may be interposed between the first to fourth active patterns F1-F4 and the third gate electrode G3. Alternatively, for example, as shown in FIG. 4, the second gate dielectric film 224 may be interposed between the first to fourth active patterns F1-F4 and the second gate electrode G2.

In some exemplary embodiments, the gate dielectric film 124, 224 may be further extended along a side surface of the gate spacer 140. For example, as shown in FIG. 2, a part of the gate dielectric film 124, 224 may be interposed between the third gate electrode G3 and the gate spacer 140. Such a gate dielectric film 124, 224 may be formed by a replacement process, for example, but the disclosure is not limited hereto.

In some exemplary embodiments, as shown in FIGS. 3 and 4, the gate dielectric film 124, 224 may be extended along a top surface of the field insulating film 110 and profiles of the first to fourth active patterns F1-F4 exposed by the field insulating film 110.

However, in some exemplary embodiments, the gate dielectric film 124, 224 may not be extended alongside surfaces of the first to fourth cut regions CT1-CT4. This is attributable to forming the first to fourth cut regions CT1-CT4 after the gate dielectric film 124, 224 is formed. However, this is merely an example and the disclosure is not limited hereto.

The gate dielectric film 124, 224 may include, for example, at least one of silicon oxide (SiO$_2$), silicon oxynitride (SiON), silicon nitride (SiN), or a high-k dielectric material having a higher dielectric constant than silicon oxide (SiO$_2$), but the disclosure is not limited hereto.

The semiconductor device according to some exemplary embodiments may further include an interface film 122, 222. The interface film 122, 222 may be interposed between each of the first to fourth active patterns F1-F4 and each of the gate dielectric film 124, 224. For example, as shown in FIGS. 2 and 3, the first interface film 122 may be interposed between the first to fourth active patterns F1-F4 and the third gate electrode G3. Alternatively, for example, as shown in FIG. 4, the second interface film 222 may be interposed between the first to fourth active patterns F1-F4 and the second gate electrode G2.

In some exemplary embodiments, as shown in FIGS. 3 and 4, the interface film 122, 222 may be extended along the profiles of the first to fourth active patterns F1-F4 exposed by the field insulating film 110.

The interface film 122, 222 may include, for example, silicon oxide, but the disclosure is not limited hereto. In some exemplary embodiments, the interface film 122, 222 may include oxide of the first to fourth active patterns F1-F4.

The source region 150S and the drain region 150D may be formed within each of the first to fourth active patterns F1-F4. In addition, the source region 150S and the drain region 150D may be disposed on both sides of each of the first to sixth gate electrodes G1-G6. The side of the gate electrode having the source region and the side of the gate electrode having the drain region is not limited to the illustration in FIG. 2, and thus the sides may be vice versa. The source region 150S and the drain region 150D may be insulated from each of the first to sixth gate electrodes G1-G6 by the gate spacer 140.

In some exemplary embodiments, the source region 150S and the drain region 150D may be formed by an epitaxial growth method. For example, as shown in FIG. 2, the source region 150S and the drain region 150D may be formed by the epitaxial growth method to fill a trench 150t within the second active pattern F2.

In some exemplary embodiments, the source region 150S and the drain region 150D may be an elevated source/drain. For example, as shown in FIG. 2, an uppermost portion of source region 150S and the drain region 150D may further protrude upwardly than a top surface of the second active pattern F2.

Although source region 150S and the drain region 150D is illustrated as a single film, the disclosure is not limited hereto. For example, the source region 150S and the drain region 150D may be formed as a multi-film including impurities of different concentrations.

When a transistor including the source region 150S and the drain region 150D is an NFET, the source region 150S and the drain region 150D may include an n-type impurity or an impurity to prevent spread of the n-type impurity. For example, the source region 150S and the drain region 150D may include at least one of P, Sb, As or a combination thereof.

In some exemplary embodiments, when the transistor including the source region 150S and the drain region 150D is the NFET, the source region 150S and the drain region 150D may include a tensile stress material. For example, when the second active pattern F2 is silicon (Si), the source region 150S and the drain region 150D may include silicon carbide (SiC).

Alternatively, when the transistor including the source region 150S and the drain region 150D is a PFET, the source region 150S and the drain region 150D may include a p-type impurity or an impurity to prevent spread of the p-type impurity. For example, the source region 150S and the drain region 150D may include at least one of B, C, In, Ga and Al or a combination thereof.

In some exemplary embodiments, when the transistor including the source region 150S and the drain region 150D is the PFET, the source region 150S and the drain region 150D may include a compression stress material. For example, when the second active pattern F2 is silicon (Si), the source region 150S and the drain region 150D may include silicon germanium (SiGe).

The interlayer insulating film 160 may be formed on the substrate 100 and the field insulating film 110. In addition, the interlayer insulating film 160 may be formed to fill a surrounding space. For example, the interlayer insulating film 160 may cover a side surface of the gate spacer 140 and a top surface of the source region 150S and the drain region 150D.

The interlayer insulating film 160 may include, for example, at least one of silicon oxide, silicon nitride, silicon oxynitride, and a low-k dielectric material with a lower dielectric constant than silicon oxide, but the disclosure is not limited hereto.

Figure 5A:
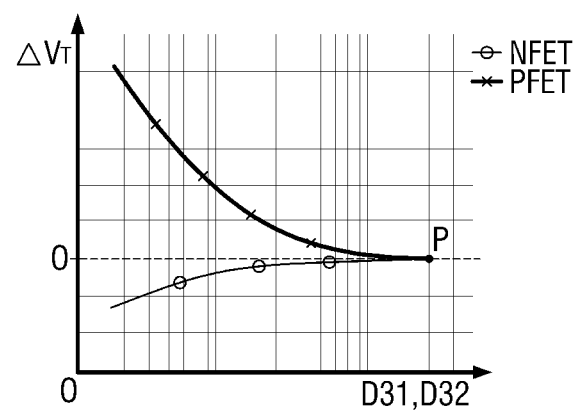
FIGS. 5A and 5B are graphs provided to explain changes in a threshold voltage and a drain current according to a position of a cut region.
Figure 5B:
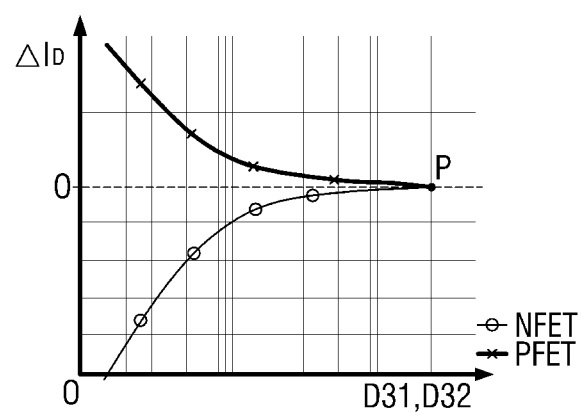

FIGS. 5A and 5B are graphs provided to explain changes in a threshold voltage and a drain current according to a position of a cut region.

Specifically, FIG. 5A is an exemplary graph provided to explain changes in a threshold voltage $V_T$ of an NFET and a PFET according to a distance between a cut region of an adjacent gate electrode and an active pattern. In addition, FIG. 5B is an exemplary graph provided to explain changes in a drain current $I_D$ of the NFET and the PFET according to the distance between the cut region of the adjacent gate electrode and the active pattern.

For convenience of explanation, it is assumed that an exemplary semiconductor device of FIGS. 5A and 5B includes the second active pattern F2, the third active pattern F3, the second gate electrode G2, the third gate electrode G3, and the third cut region CT3 of FIG. 1. For reference, a point P of FIGS. 5A and 5B refers to a case in which the third cut region CT3 is not included.

Referring to FIG. 5A, in the case of the NFET, it can be seen that, as the distance between the cut region of the adjacent gate electrode and the active pattern decreases, a change $\Delta V_T$ of the threshold voltage decreases. For example, as the distance D31 between the third cut region CT3, which cuts the second gate electrode G2, and the second active pattern F2 decreases, the threshold voltage $V_T$ of the transistor including the third gate electrode G3 and the second active pattern F2 may decrease.

However, in the case of the PFET, it can be seen that, as the distance between the cut region of the adjacent gate electrode and the active pattern decreases, the change $\Delta V_T$ of the threshold voltage increases. For example, as the distance D32 between the third cut region CT3, which cuts the second gate electrode G2, and the third active pattern F3 decreases, the threshold voltage $V_T$ of the transistor including the third gate electrode G3 and the third active pattern F3 may increase.

Likewise, referring to FIG. 5B, in the case of the NFET, it can be seen that, as the distance between the cut region of the adjacent gate electrode and the active pattern decreases, a change $\Delta I_D$ of the drain current increases. For example, as the distance D31 between the third cut region CT3, which cuts the second gate electrode G2, and the second active pattern F2 decreases, the drain current $I_D$ of the transistor including the third gate electrode G3 and the second active pattern F2 may increase.

However, in the case of the PFET, it can be seen that, as the distance between the cut region of the adjacent gate electrode and the active pattern decreases, the change $\Delta I_D$ of the drain current decreases. For example, as the distance D32 between the third cut region CT3, which cuts the second gate electrode G2, and the third active pattern F3 decreases, the drain current $I_D$ of the transistor including the third gate electrode G3 and the third active pattern F3 may decrease.

As described above, in some exemplary embodiments, the distance D31 between the second active pattern F2 and the third cut region CT3 may be relatively short, and the distance D32 between the third active pattern F3 and the third cut region CT3 may be relatively long. Accordingly, when the second active pattern F2 is the NFET region, the drain current $I_D$ of the transistor including the second active pattern F2 and the third gate electrode G3 may increase. In addition, when the third active pattern F3 is the PFET region, the drain current $I_D$ of the transistor including the third active pattern F3 and the third gate electrode G3 may be prevented from decreasing. Accordingly, the semiconductor device having enhanced operation performance may be provided.

Figure 6:
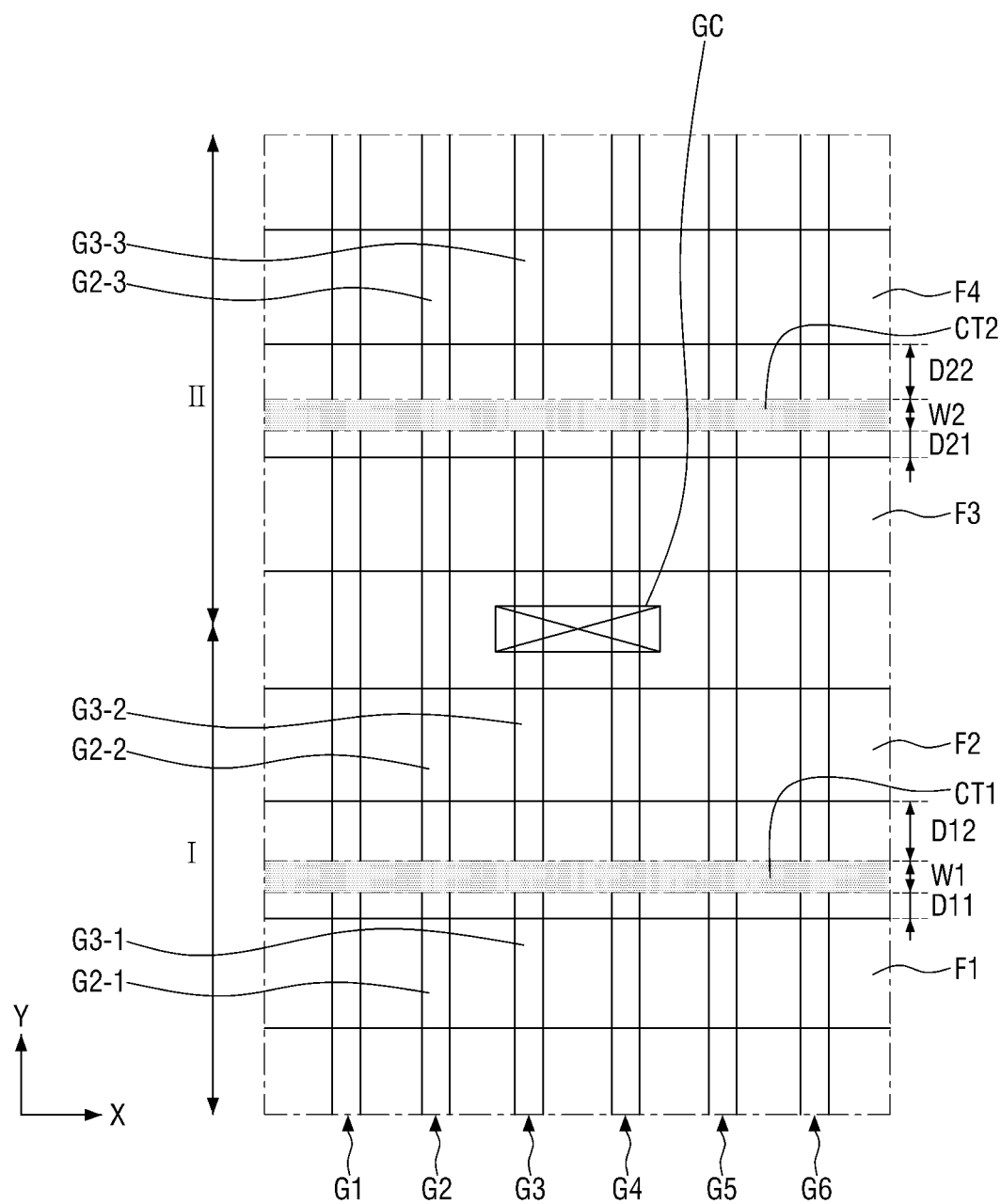
FIG. 6 is a layout view provided to explain a semiconductor device according to another exemplary embodiment.

FIG. 6 is a layout view provided to explain a semiconductor device according to according to another embodiment. For convenience of explanation, elements or operations overlapping with those already described above with reference to FIGS. 1 to 5 will not be described or described as briefly as possible for the sake of brevity.

Referring to FIG. 6, in the semiconductor device according to some exemplary embodiments, the distance D21 between the third active pattern F3 and the second cut region CT2 may be different from the distance D12 between the second active pattern F2 and the first cut region CT1.

In addition, as shown in the drawing, the distance D21 between the third active pattern F3 and the second cut region CT2 may be shorter than the distance D12 between the second active pattern F2 and the first cut region CT1. In this case, operation performance of the transistor including the third active pattern F3, which is the PFET region, can be enhanced. This will be described in detail in the explanation of FIGS. 7A and 7B.

In some exemplary embodiments, the first, second, fifth, and sixth gate electrodes G1, G2, G5, G6 between the first cut region CT1 and the second cut region CT2 may not be cut. For example, the semiconductor device of FIG. 6 may not include the third and fourth cut regions CT3, CT4 of FIG. 1. For example, the second gate electrode G2 may include a second portion G2-2 and a third portion G2-3 which are electrically disconnected by the second cut region CT2.

In some exemplary embodiments, the distance D21 between the third active pattern F3 and the second cut region CT2 may be shorter than the distance D22 between the fourth active pattern F4 and the second cut region CT2. In addition, in some exemplary embodiments, the distance D12 between the second active pattern F2 and the first cut region CT1 may be longer than the distance D11 between the first active pattern F1 and the first cut region CT1.

Figure 7A:
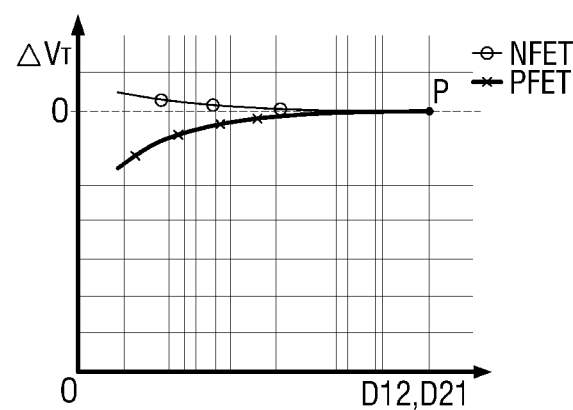
FIGS. 7A and 7B are graphs provided to explain changes in a threshold voltage and a drain current according to a position of a cut region.
Figure 7B:
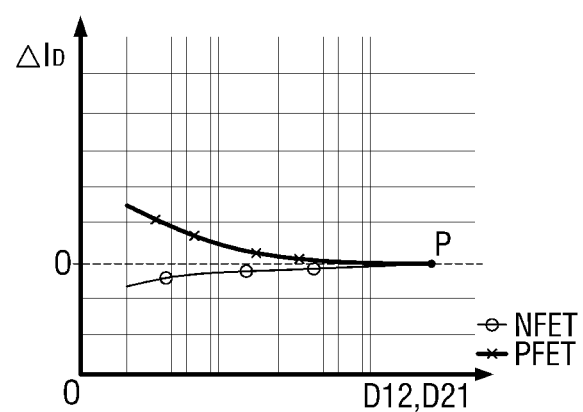

FIGS. 7A and 7B are graphs provided to explain changes in a threshold voltage and a drain current according to a position of a cut region.

Specifically, FIG. 7A is an exemplary graph provided to explain changes in a threshold voltage $V_T$ of an NFET and the PFET according to a distance between a cut region of a gate electrode and an active pattern. In addition, FIG. 7B is an exemplary graph provided to explain changes in a drain current $I_D$ of the NFET and the PFET according to the distance between the cut region of the gate electrode and the active pattern.

For convenience of explanation, it is assumed that an exemplary semiconductor device of FIGS. 7A and 7B include the second active pattern F2, the third active pattern F3, and the third gate electrode G3 of FIG. 6. For reference, a point P of FIGS. 7A and 7B refers to a case in which the first cut region CT1 or the second cut region CT2 is not included.

Referring to FIG. 7A, in the case of the NFET, it can be seen that, as the distance between the cut region of the gate electrode and the active pattern decreases, a change $\Delta V_T$ of the threshold voltage increases. For example, as the distance D12 between the first cut region CT1, which cuts the third gate electrode G3, and the second active pattern F2 decreases, the threshold voltage $V_T$ of the transistor including the third gate electrode G3 and the second active pattern F2 may increase.

However, in the case of the PFET, it can be seen that, as the distance between the cut region of the gate electrode and the active pattern decreases, the change $\Delta V_T$ of the threshold voltage decreases. For example, as the distance D21 between the second cut region CT2, which cuts the third gate electrode G3, and the third active pattern F3 decreases, the threshold voltage $V_T$ of the transistor including the third gate electrode G3 and the third active pattern F3 may decrease.

Likewise, referring to FIG. 7B, in the case of the NFET, it can be seen that, as the distance between the cut region of the gate electrode and the active pattern decreases, a change $\Delta I_D$ of the drain current decreases. For example, as the distance D12 between the first cut region CT1, which cuts the third gate electrode G3, and the second active pattern F2 decreases, the drain current $I_D$ of the transistor including the third gate electrode G3 and the second active pattern F2 may decrease.

However, in the case of the PFET, it can be seen that, as the distance between the cut region of the gate electrode and the active pattern decreases, the change $\Delta I_D$ of the drain current increases. For example, as the distance D21 between the second cut region CT2, which cuts the third gate electrode G3, and the third active pattern F3 decreases, the drain current $I_D$ of the transistor including the third gate electrode G3 and the third active pattern F3 may increase.

As described above, in some exemplary embodiments, the distance D21 between the third active pattern F3 and the second cut region CT2 may be relatively short, and the distance D12 between the second active pattern F2 and the first cut region CT1 may be relatively long. Accordingly, when the third active pattern F3 is the PFET region, the drain current $I_D$ of the transistor including the third active pattern F3 and the third gate electrode G3 may increase. In addition, when the second active pattern F2 is the NFET region, the drain current $I_D$ of the transistor including the second active pattern F2 and the third gate electrode G3 may be prevented from decreasing. Accordingly, the semiconductor device having enhanced operation performance may be provided.

Figure 8:
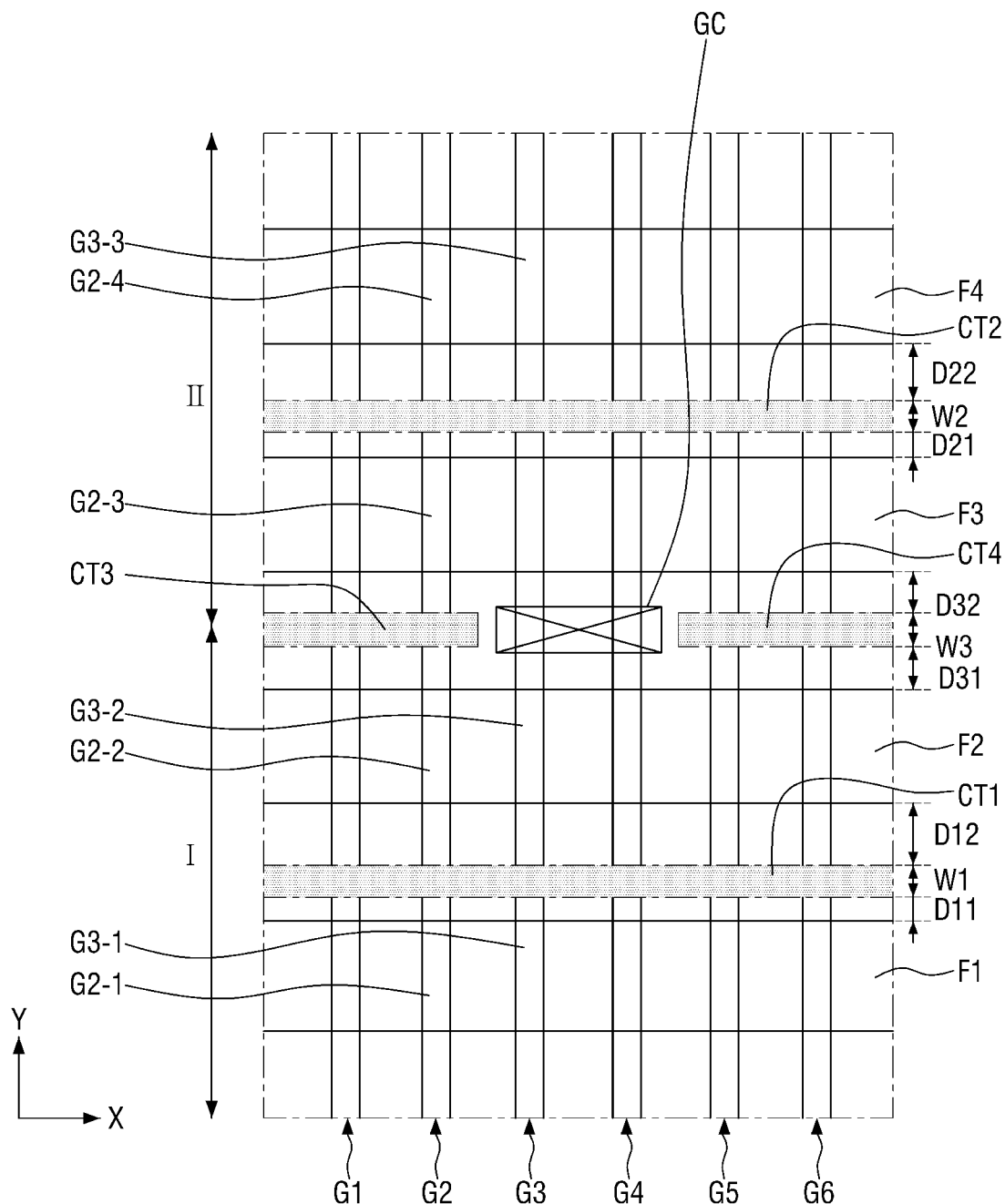
FIGS. 8 and 9 are layout views provided to explain a semiconductor device according to another exemplary embodiment.
Figure 9:
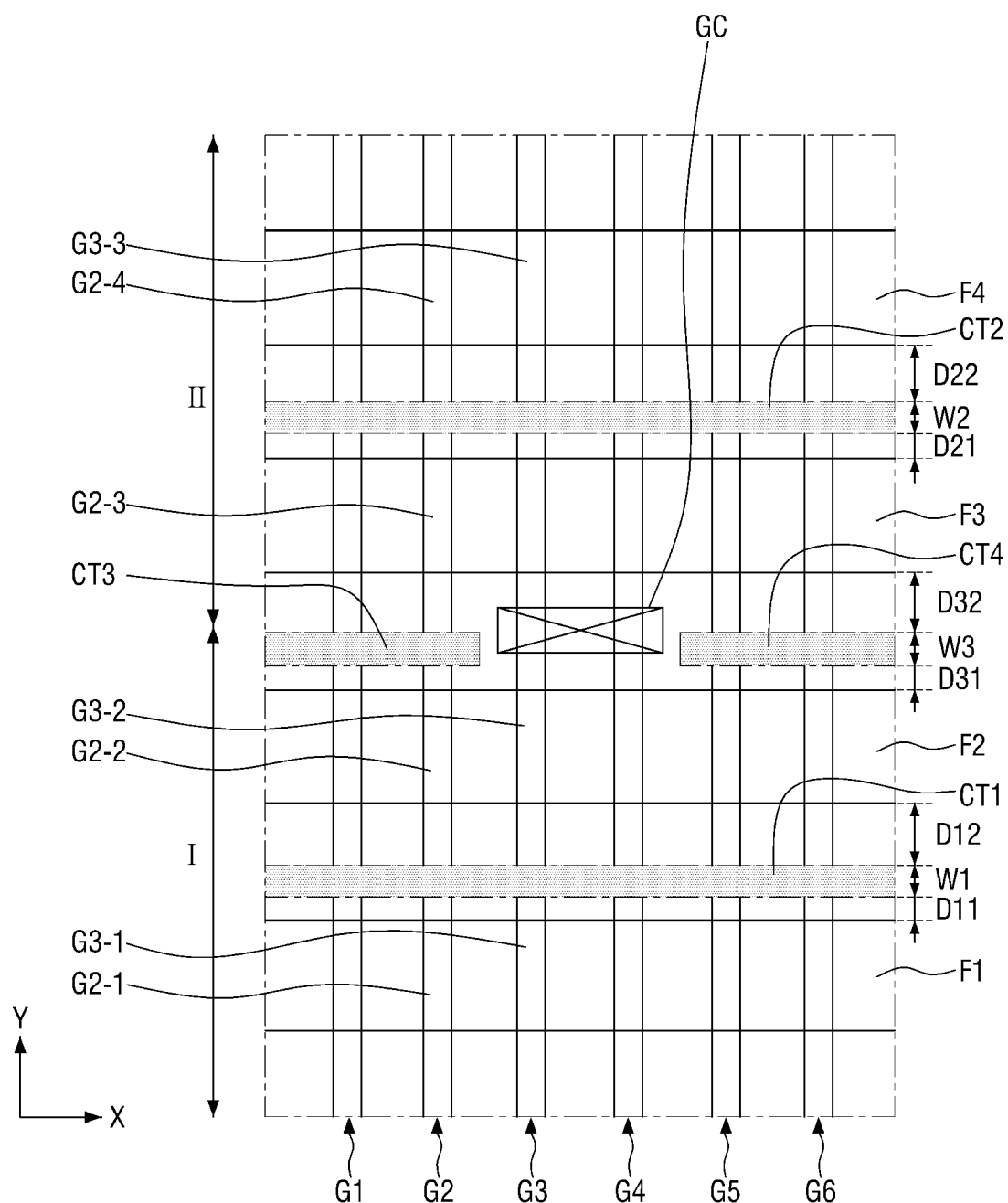

FIGS. 8 and 9 are layout views provided to explain a semiconductor device according to some exemplary embodiments. For convenience of explanation, elements or operations overlapping with those already described above with reference to FIGS. 1 to 7 will not be described or described as briefly as possible for the sake of brevity.

Referring to FIG. 8, the semiconductor device according to another exemplary embodiment further includes the third and fourth cut regions CT3, CT4.

In this case, operation performance of the transistor including the second active pattern F2, which is the NFET region, can be enhanced. For example, as described in the explanation of FIG. 5B, when the third cut region CT3 is positioned, the drain current $I_D$ of the transistor including the third gate electrode G3 and the second active pattern F2 may increase. Accordingly, the semiconductor device having further enhanced operation performance of the NFET may be provided.

In some exemplary embodiments, the distance D31 between the second active pattern F2 and the third and fourth cut regions CT3, CT4 may be the same as the distance D32 between the third active pattern F3 and the third and fourth cut regions CT3, CT4.

Referring to FIG. 9, in the semiconductor device according to some exemplary embodiments, the distance D31 between the second active pattern F2 and the third and fourth cut regions CT3, CT4 may be different from the distance D32 between the third active pattern F3 and the third and fourth cut regions CT3, CT4.

For example, the distance D31 between the second active pattern F2 and the third and fourth cut regions CT3, CT4 may be shorter than the distance D32 between the third active pattern F3 and the third and fourth cut regions CT3, CT4.

In this case, as described above in the explanation of FIGS. 5B, the drain current $I_D$ of the transistor including the second active pattern F2 and the third gate electrode G3 may increase. In addition, the drain current $I_D$ of the transistor including the third active pattern F3 and the third gate electrode G3 may be prevented from decreasing. Accordingly, the semiconductor device with further improved operation performance can be provided.

Figure 10A:
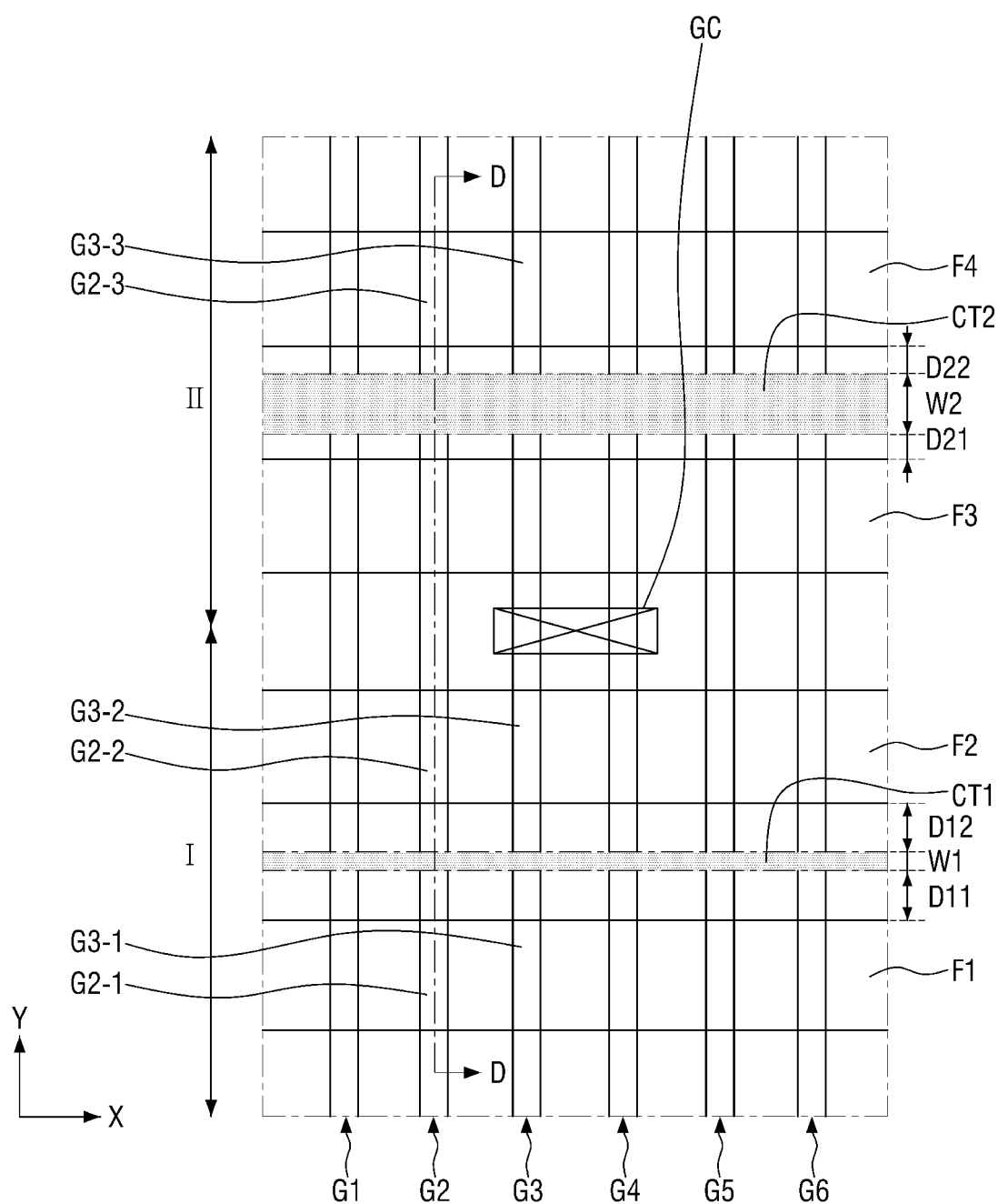
FIGS. 10A to 10C are views provided to explain a semiconductor device according to another exemplary embodiment.
Figure 10B:
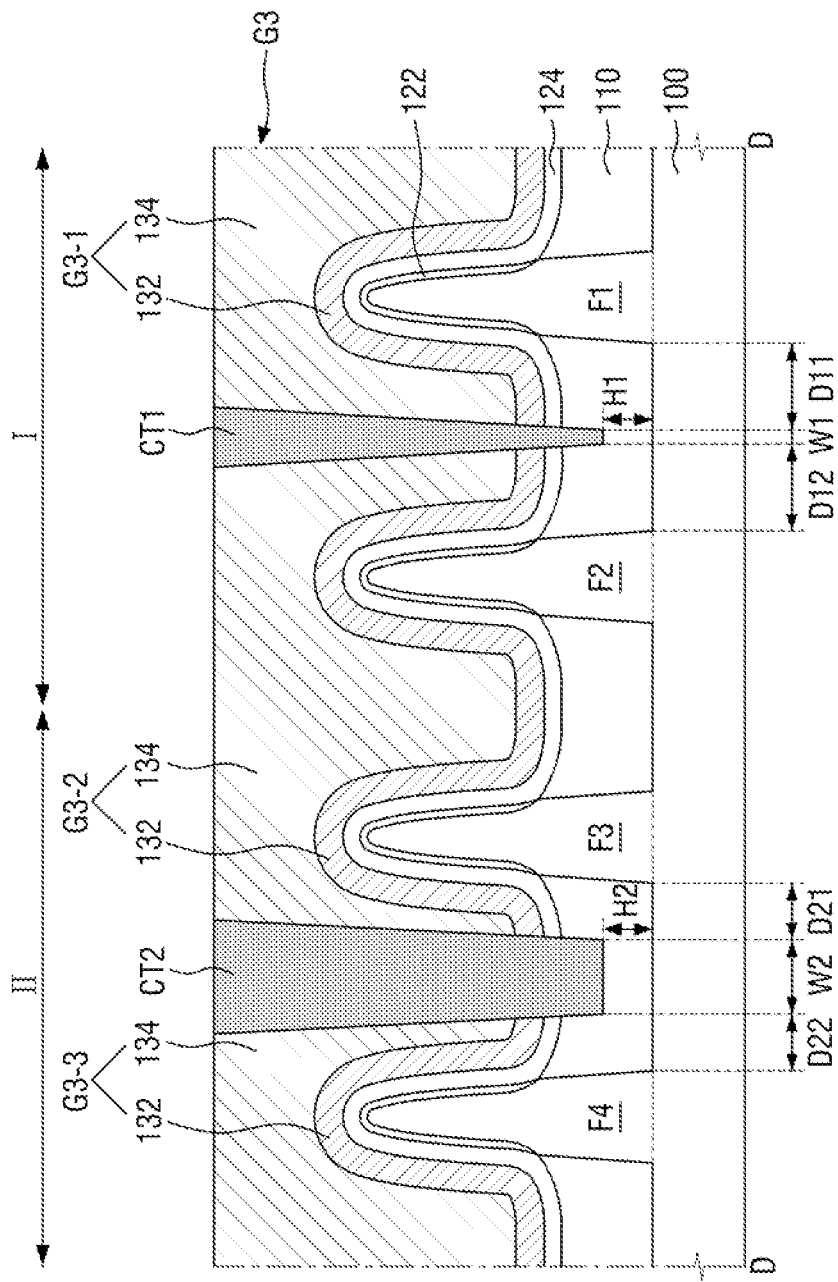
Figure 10C:
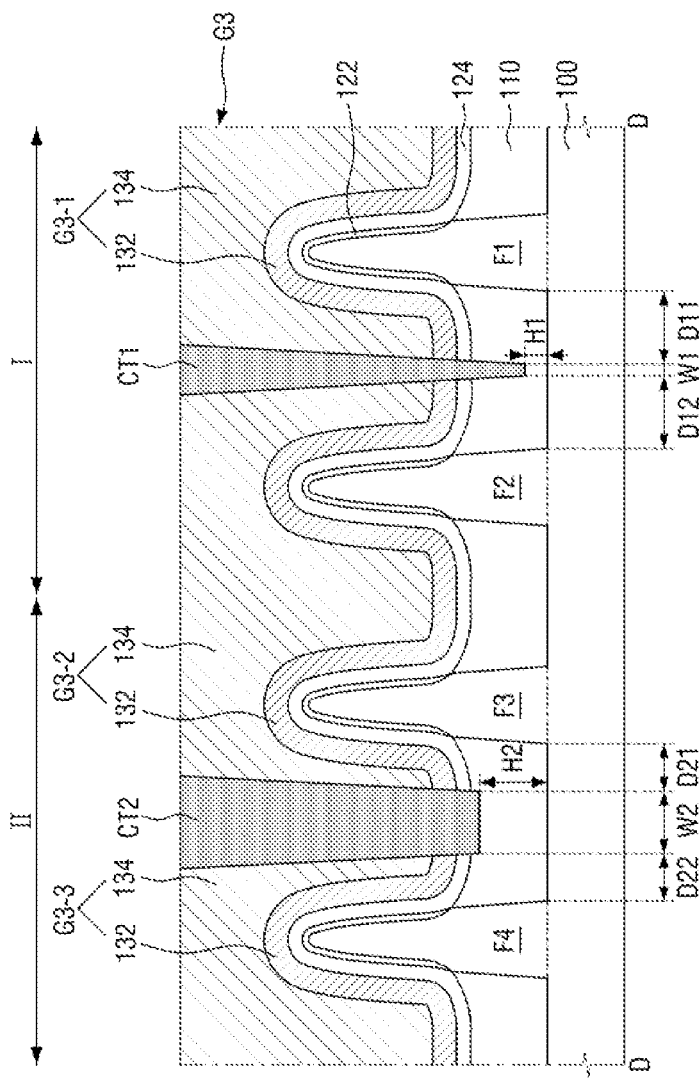
Figure 11A:
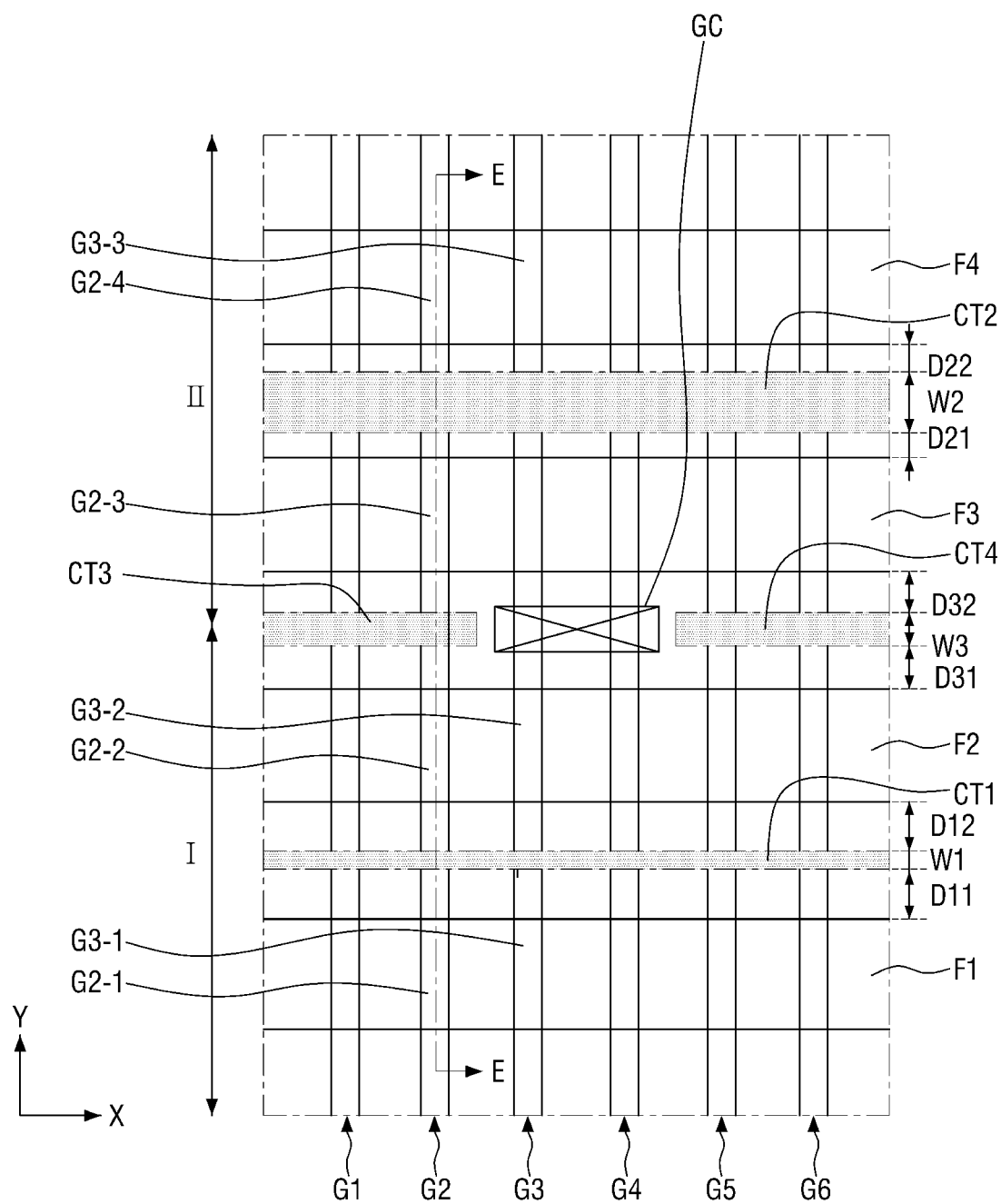
FIGS. 11A to 11C are views provided to explain a semiconductor device according to another exemplary embodiment.
Figure 11B:
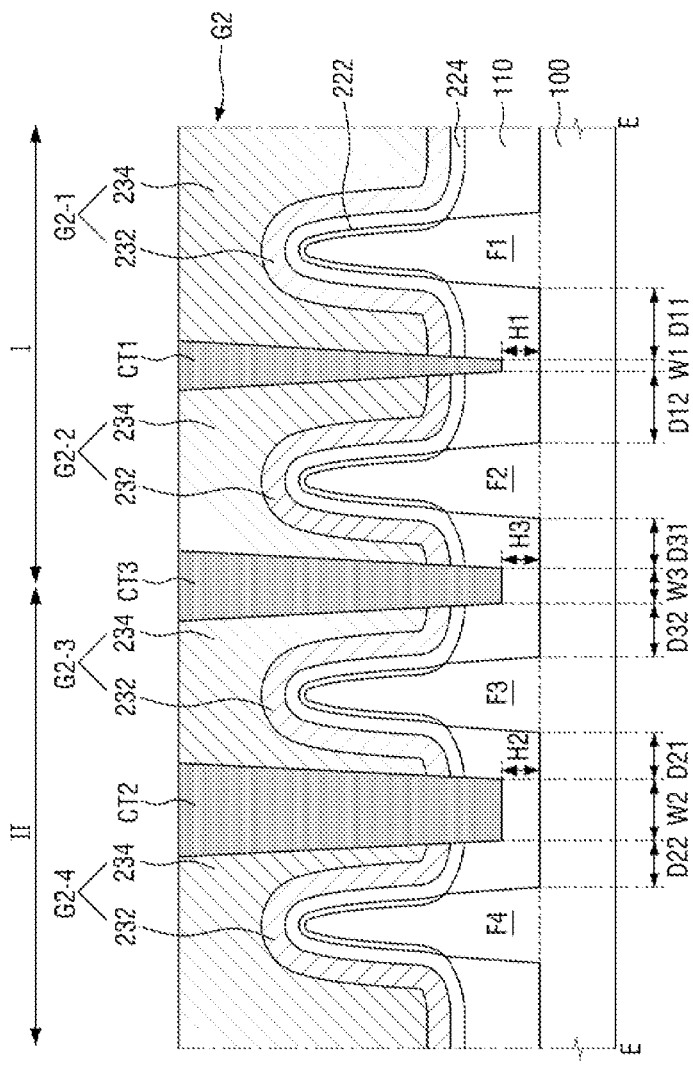
Figure 11C:
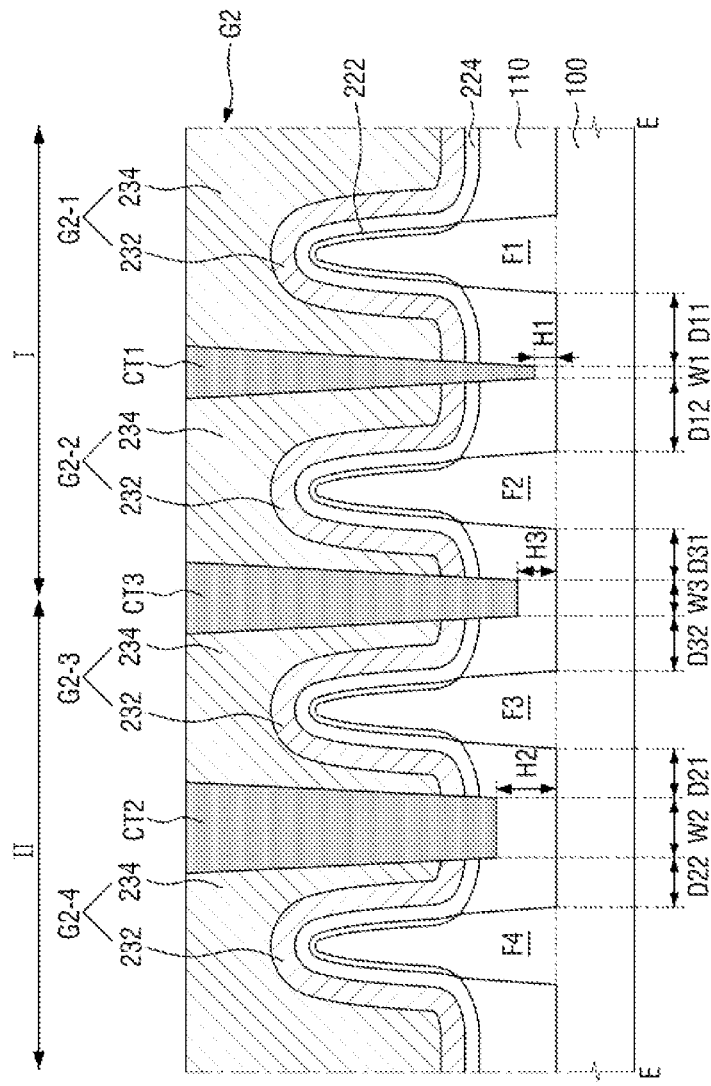
Figure 12A:
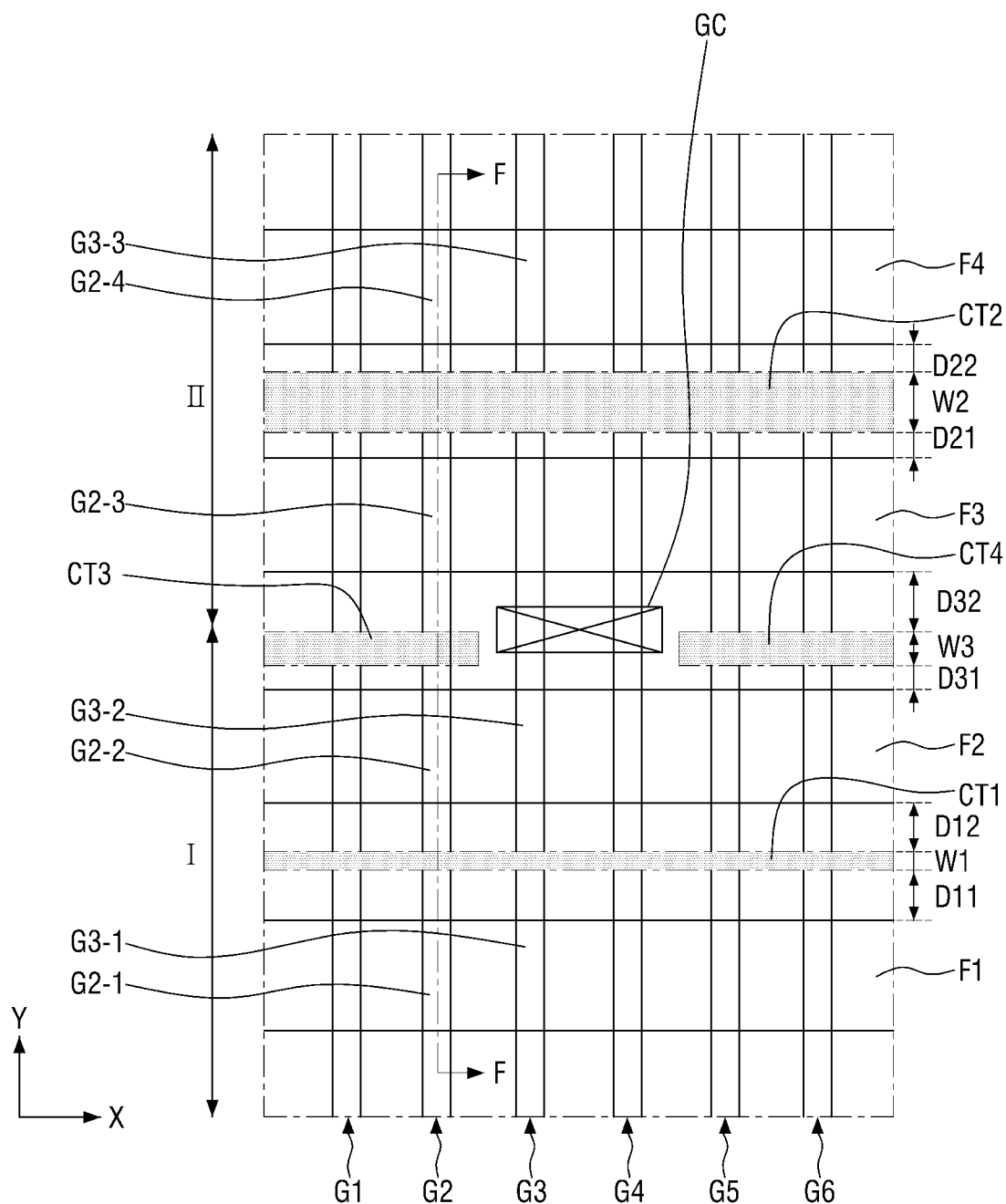
FIGS. 12A to 12B are views provided to explain a semiconductor device according to another exemplary embodiment.
Figure 12B:
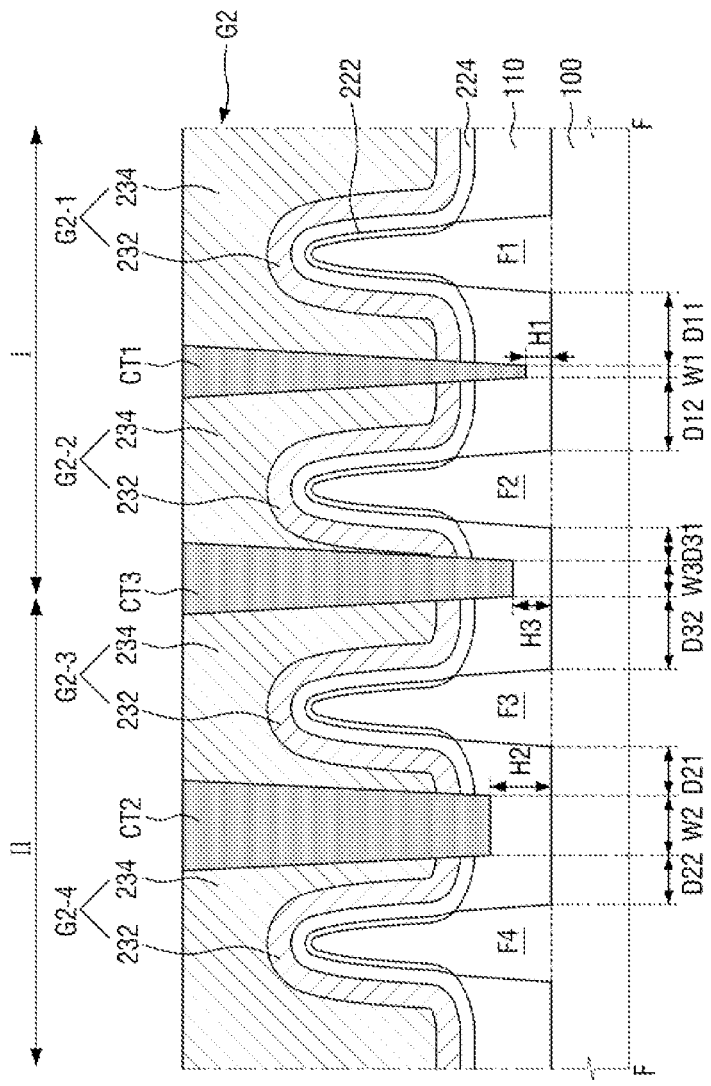

FIGS. 10A to 10C, FIGS. 11A to 11C, FIGS. 12A to 12B are views provided to explain a semiconductor device according to some exemplary embodiments. For reference, FIGS. 10B and 10C are cross-sectional views taken on D-D of FIG. 10A. FIGS. 11B and 11C are cross-sectional views taken on E-E of FIG. 11A, and FIG. 12B is a cross-sectional view take on F-F of FIG. 12A.

Referring to FIGS. 10A and 10B, in the semiconductor device according to some exemplary embodiments, the width W2 of the second cut region CT2 may be different from the width W1 of the first cut region CT1.

For example, the width W2 of the second cut region CT2 may be larger than the width W1 of the first cut region CT1. Herein, the term "width" refers to a width in the second direction Y.

As the width W1 of the first cut region CT1 is relatively smaller, the distance D12 between the second active pattern F2 and the first cut region CT1 may relatively increase. In addition, as the width W2 of the second cut region CT2 is relatively larger, the distance D21 between the third active pattern F3 and the second cut region CT2 may relatively decrease.

In this case, as described above in the explanation of FIGS. 7B, the drain current $I_D$ of the transistor including the third active pattern F3 and the third gate electrode G3 may increase. In addition, the drain current $I_D$ of the transistor including the second active pattern F2 and the third gate electrode G3 may be prevented from decreasing. Accordingly, the semiconductor device having enhanced operation performance can be provided.

In some exemplary embodiments, the distance D11 between the first active pattern F1 and the first cut region CT1 may be the same as the distance D12 between the second active pattern F2 and the first cut region CT1. In addition, in some exemplary embodiments, the distance D21 between the third active pattern F3 and the second cut region CT2 may be the same as the distance D22 between the fourth active pattern F4 and the second cut region CT2.

In some exemplary embodiments, the first cut region CT1 and the second cut region CT2 may have the same depth. For example, as shown in FIG. 10B, a height H1 of the bottom surface of the first cut region CT1 from the top surface of the substrate 100 may be the same as a height H2 of the bottom surface of the second cut region CT2.

Referring to FIGS. 10A and 10C, in the semiconductor device according to some exemplary embodiments, the first cut region CT1 and the second cut region CT2 may have depths different from each other.

For example, as shown in FIG. 10C, the height H1 of the bottom surface of the first cut region CT1 from the top surface of the substrate 100 may be different from the height H2 of the bottom surface of the second cut region CT2. For example, the height H1 of the bottom surface of the first cut region CT1 may be lower than the height H2 of the bottom surface of the second cut region CT2.

This is attributable to characteristics of an etching process for forming the first cut region CT1 and the second cut region CT2. For example, in an etching process for forming the first cut region CT1 and the second cut region CT2, a by-product such as polymer may be generated and may hinder inflow of an etchant, thereby reducing an etching speed. Many by-products may be generated as a width of a cut region where such products are generated is wider. Accordingly, in some exemplary embodiments, a depth of the second cut region CT2 having a larger width than the first cut region CT1 may be shallower than a depth of the first cut region CT1.

Referring to FIGS. 11A and 11B, the semiconductor device according to some exemplary embodiments further includes the third and fourth cut regions CT3, CT4.

In this case, operation performance of the transistor including the second active pattern F2, which is the NFET region, can be enhanced. For example, as described above in the explanation of FIGS. 5D, when the third cut region CT3 is positioned, the drain current $I_D$ of the transistor including the third gate electrode G3 and the second active pattern F2 may increase. Accordingly, the semiconductor device with further enhanced operation performance of the NFET may be provided.

According to some exemplary embodiments, the first cut region CT1, the second cut region CT2, and the third cut region CT3 may have the same depth. For example, as shown in FIG. 11B, a height H3 of the bottom surface of the third cut region CT3 from the top surface of the substrate 100 may be the same as the height H1 of the bottom surface of the first cut region CT1 and the height H2 of the bottom surface of the second cut region CT2.

Referring to FIGS. 11A and 11C, in the semiconductor device according to some exemplary embodiments, the first cut region CT1, the second cut region CT2, and the third cut region CT3 may have depths different from one another.

For example, as shown in FIG. 11C, the height H3 of the bottom surface of the third cut region CT3 from the top surface of the substrate 100 may be different from the height H1 of the bottom surface of the first cut region CT1 and the height H2 of the bottom surface of the second cut region CT2. For example, the height H3 of the bottom surface of the third cut region CT3 may be higher than the height H1 of the bottom surface of the first cut region CT1, and may be lower than the height H2 of the bottom surface of the second cut region CT2. This may be attributable to characteristics of an etching process for forming the first cut region CT1, the second cut region CT2 and the third cut region CT3, but this should not be considered as limiting.

Referring to FIGS. 12A and 12B, in the semiconductor device according to some exemplary embodiments, the distance D31 between the second active pattern F2 and the third and fourth cut regions CT3, CT4 may be different from the distance D32 between the third active pattern F3 and the third and fourth cut regions CT3, CT4.

For example, the distance D31 between the second active pattern F2 and the third and fourth cut regions CT3, CT4 may be shorter than the distance D32 between the third active pattern F3 and the third and fourth cut regions CT3, CT4.

In this case, as described above in the explanation of FIGS. 5B, the drain current $I_D$ of the transistor including the second active pattern F2 and the third gate electrode G3 may increase. In addition, the drain current $I_D$ of the transistor including the third active pattern F3 and the third gate electrode G3 may be prevented from decreasing. Accordingly, the semiconductor device with further improved operation performance may be provided.

Figure 13:
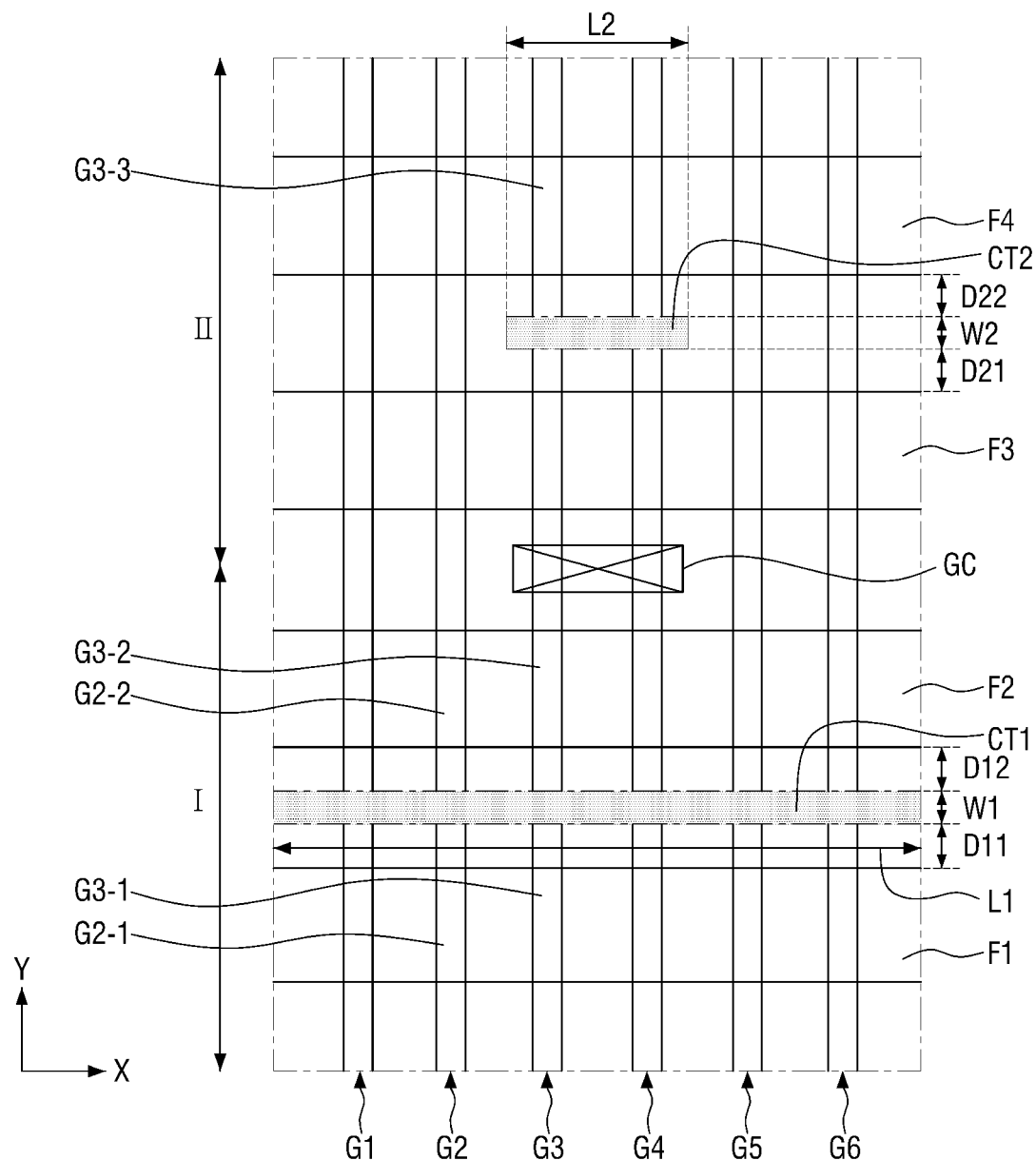
FIG. 13 is a layout view provided to explain a semiconductor device according to some exemplary embodiments.

FIG. 13 is a layout view provided to explain a semiconductor device according to another exemplary embodiment. For convenience of explanation, elements or operations overlapping with those already described above with reference to FIGS. 1 to 12B will not be described or described as briefly as possible for the sake of brevity.

Referring to FIG. 13, in the semiconductor device according to some exemplary embodiments, a length L2 of the second cut region CT2 may be different from a length L1 of the first cut region CT1.

For example, as shown in the drawing, the length L2 of the second cut region CT2 extended in the first direction X may be shorter than the length L1 of the first cut region CT1 extended in the first direction X. In this case, operation performance of the transistor including the third active pattern F3, which is the PFET region, can be enhanced. This will be described in detail in the explanation of FIGS. 14A and 14B.

In some exemplary embodiments, the second cut region CT2 may not cut the first, second, fifth, and sixth gate electrodes G1, G2, G5, G6. For example, a second portion G2-2 of the second gate electrode G2 may not be cut by the second cut region CT2.

In some exemplary embodiments, the first, second, fifth, and sixth gate electrodes G1, G2, G5, G6 between the first cut region CT1 and the second cut region CT2 may not be cut. For example, the semiconductor device of FIG. 13 may not include the third and fourth cut regions CT3, CT4 of FIG. 1.

Figure 14A:
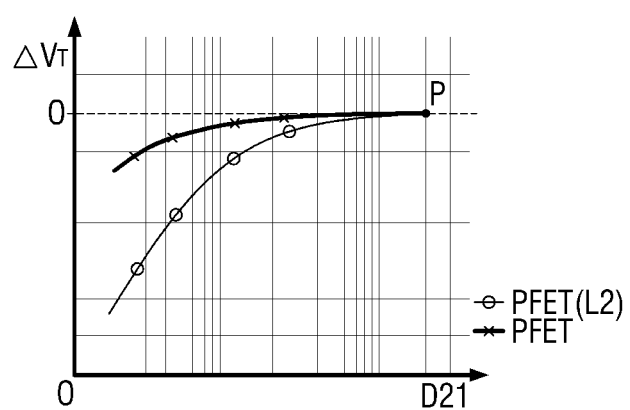
FIGS. 14A and 14B provided to explain changes in a threshold voltage and a drain current according to a length of a cut region.
Figure 14B:
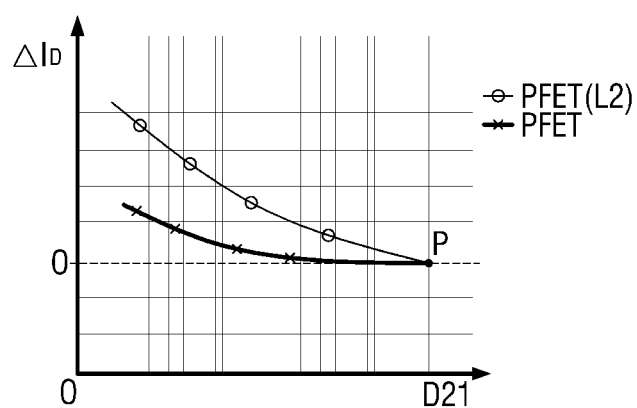

FIGS. 14A and 14B are graphs provided to explain changes in a threshold voltage and a drain current according to a length of a cut region.

Specifically, FIG. 14A is an exemplary graph provided to explain changes in a threshold voltage $V_T$ of a PFET according to a length of a cut region. In addition, FIG. 14B is an exemplary graph provided to explain changes in a drain current $I_D$ of the PFET according to the length of the cut region.

For convenience of explanation, it is assumed that an exemplary first semiconductor device PFET (L2) of FIGS. 14A and 14B includes the third active pattern F3 and the third gate electrode G3 of FIG. 13. In addition, it is assumed that an exemplary second semiconductor device PFET of FIGS. 14A and 14B includes the third active pattern F3 and the third gate electrode G3 of FIG. 6. For reference, a point P of FIGS. 14A and 14B refers to a case in which the second cut region CT2 is not included.

Referring to FIG. 14A, in the case of the PFET, it can be seen that, as the length of the cut region decreases, a change $\Delta V_T$ of the threshold voltage decreases. For example, as the length of the second cut region CT2 of FIG. 6 decreases to the length L2 of the second cut region CT2 of FIG. 13, the threshold voltage $V_T$ of the transistor including the third gate electrode G3 and the third active pattern F3 may decrease.

Likewise, referring to FIG. 14B, in the case of the PFET, it can be seen that, as the length of the cut region decreases, a change $\Delta I_D$ of the drain current increases. For example, as the length of the second cut region CT2 of FIG. 6 decreases to the length L2 of the second cut region CT2 of FIG. 13, the drain current $I_D$ of the transistor including the third gate electrode G3 and the third active pattern F3 may increase.

As described above, in some exemplary embodiments, the length L2 of the second cut region CT2 may be relatively short. Accordingly, when the third active pattern F3 is the PFET, the drain current I D of the transistor including the third active pattern F3 and the third gate electrode G3 may increase. Accordingly, the semiconductor device with enhanced operation performance of the PFET may be provided.

Figure 15:
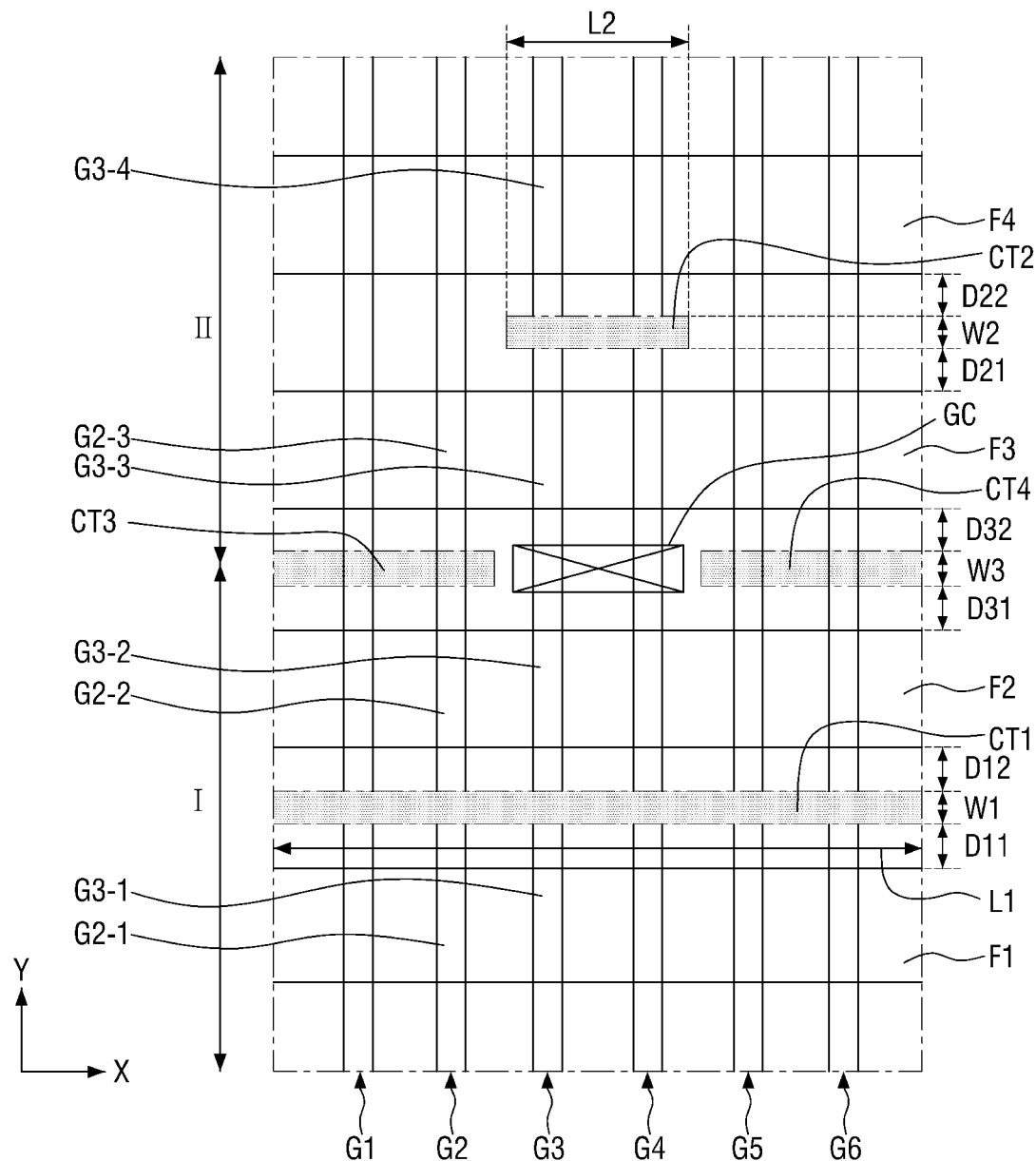
FIGS. 15 and 16 are layout views provided to explain a semiconductor device according to some exemplary embodiments.
Figure 16:
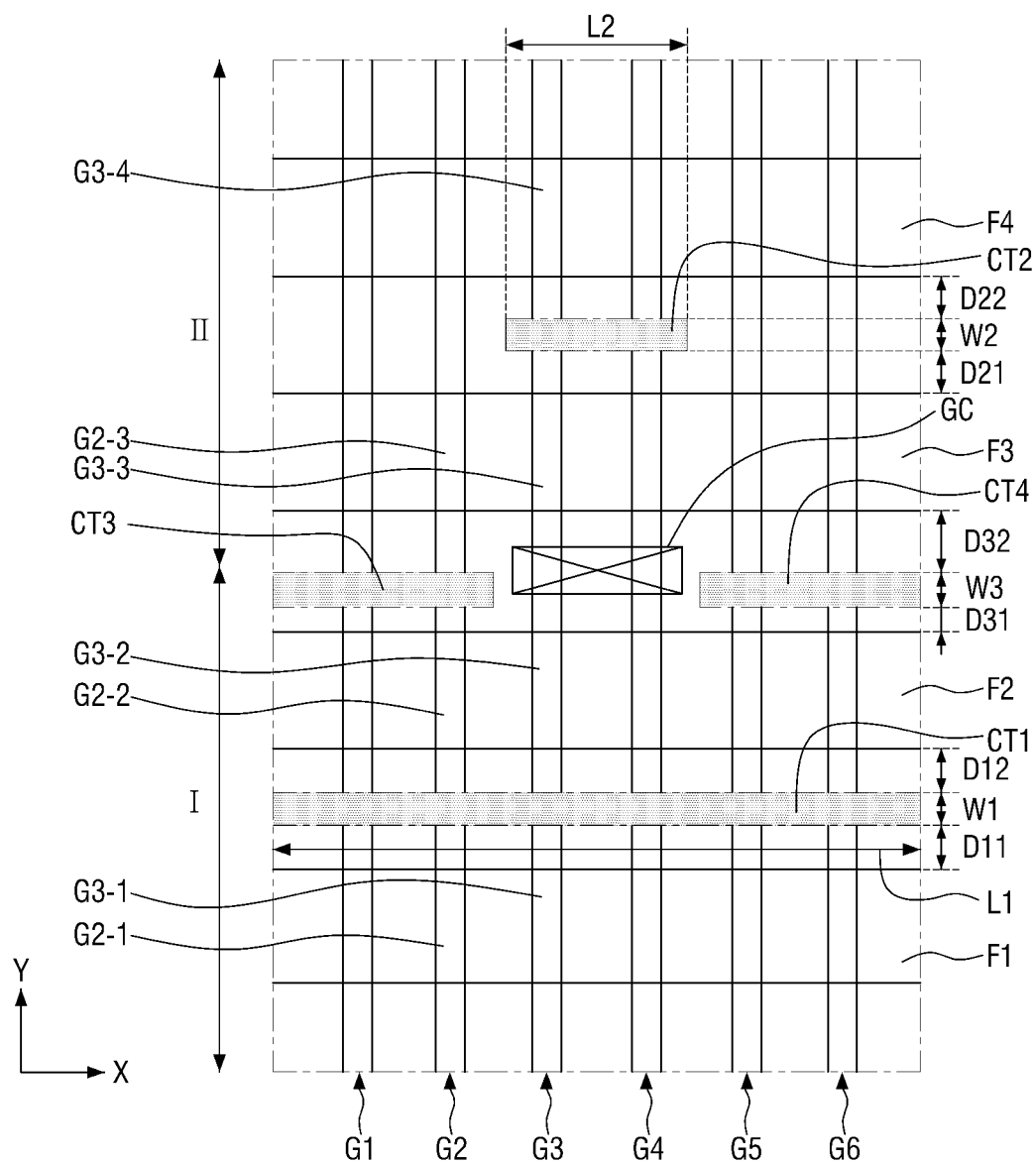

FIGS. 15 and 16 are layout views provided to explain a semiconductor device according to some exemplary embodiments. For convenience of explanation, elements or operations overlapping with those already described above with reference to FIGS. 1 to 14 will not be described or described as briefly as possible for the sake of brevity.

Referring to FIG. 15, the semiconductor device according to some exemplary embodiments further includes the third and fourth cut regions CT3, CT4.

In this case, operation performance of the transistor including the second active pattern F2, which is the NFET region, can be enhanced. For example, as described above in the explanation of FIGS. 5A and 5B, when the third cut region CT3 is positioned, the drain current $I_D$ of the transistor including the third gate electrode G3 and the second active pattern F2 may increase. Accordingly, the semiconductor device with further enhanced operation performance of the NFET may be provided.

Referring to FIG. 16, in the semiconductor device according to some exemplary embodiments, the distance D31 between the second active pattern F2 and the third and fourth cut regions CT3, CT4 may be different from the distance D32 between the third active pattern F3 and the third and fourth cut regions CT3, CT4.

For example, the distance D31 between the second active pattern F2 and the third and fourth cut regions CT3, CT4 may be shorter than the distance D32 between the third active pattern F3 and the third and fourth cut regions CT3, CT4.

In this case, as described above in the explanation of FIGS. 5A and 5B, the drain current $I_D$ of the transistor including the second active pattern F2 and the third gate electrode G3 may increase. In addition, the drain current $I_D$ of the transistor including the third active pattern F3 and the third gate electrode G3 may be prevented from decreasing. Accordingly, the semiconductor device with further improved operation performance may be provided.

Figure 17A:
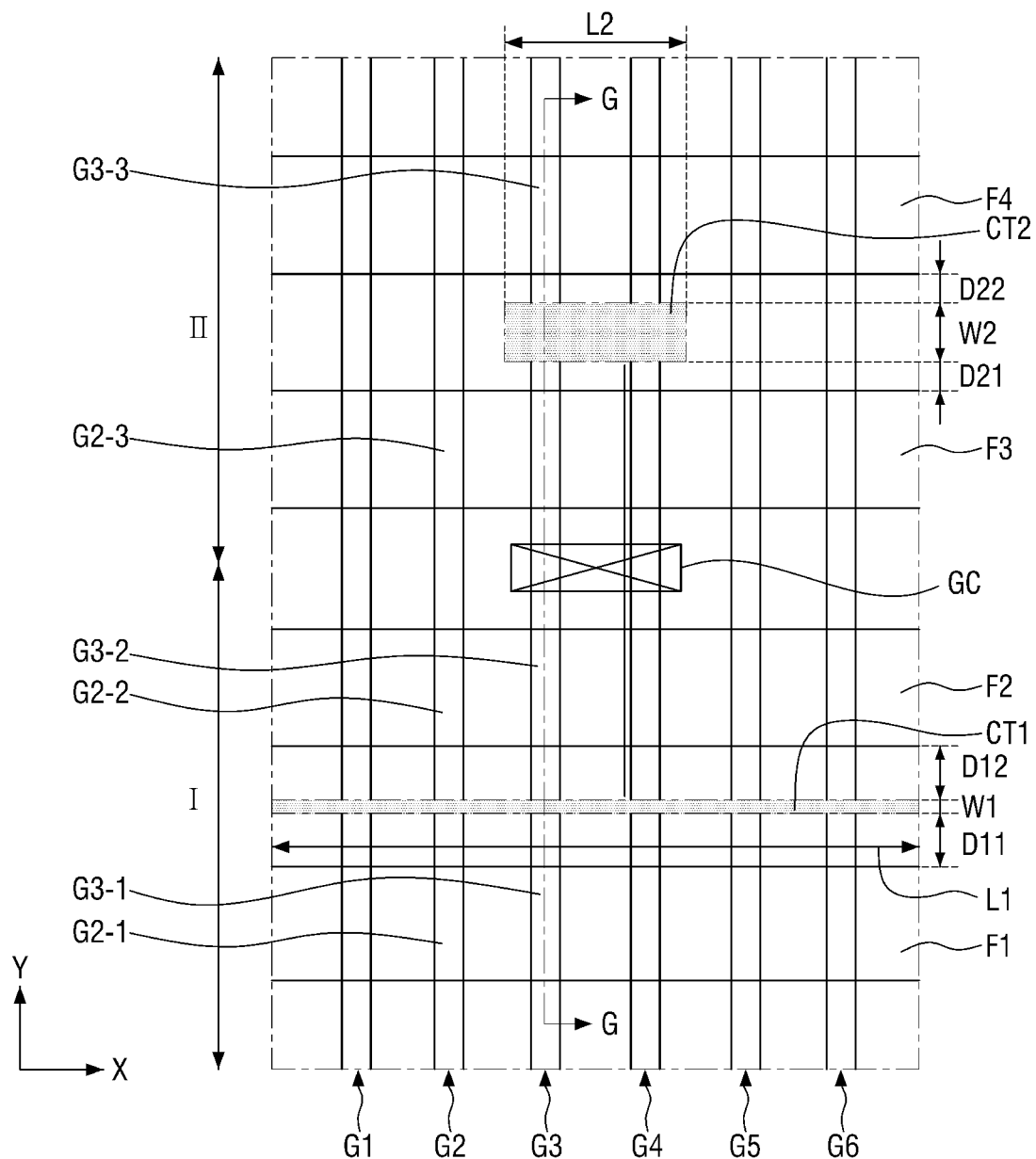
FIGS. 17A to 17B are views provided to explain a semiconductor device according to another exemplary embodiment.
Figure 17B:
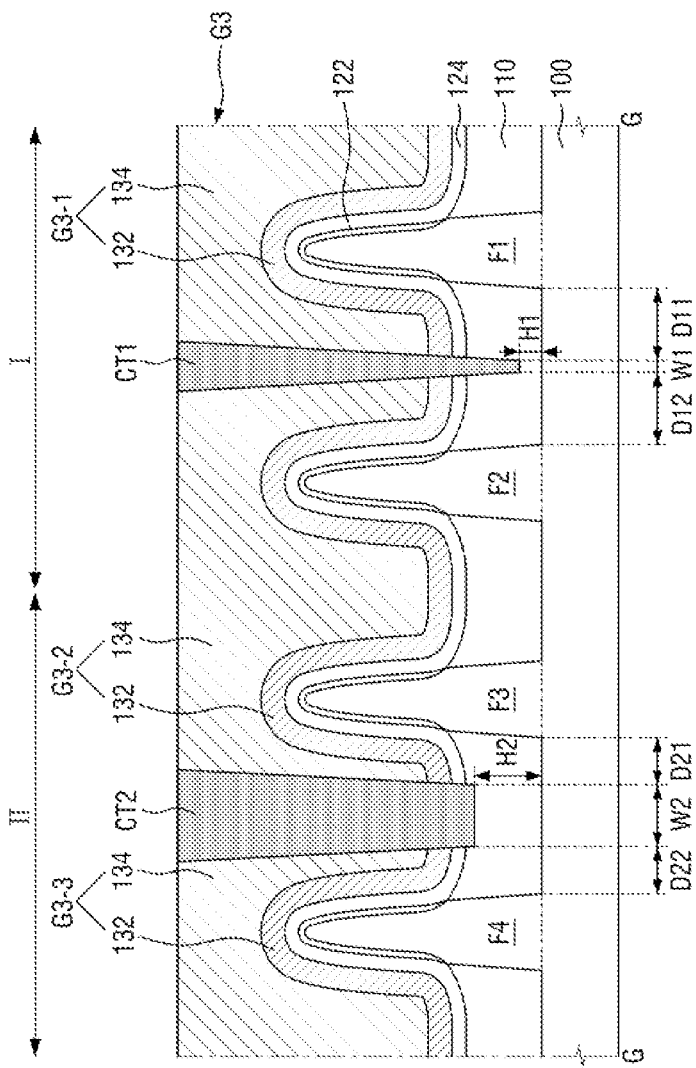
Figure 18A:
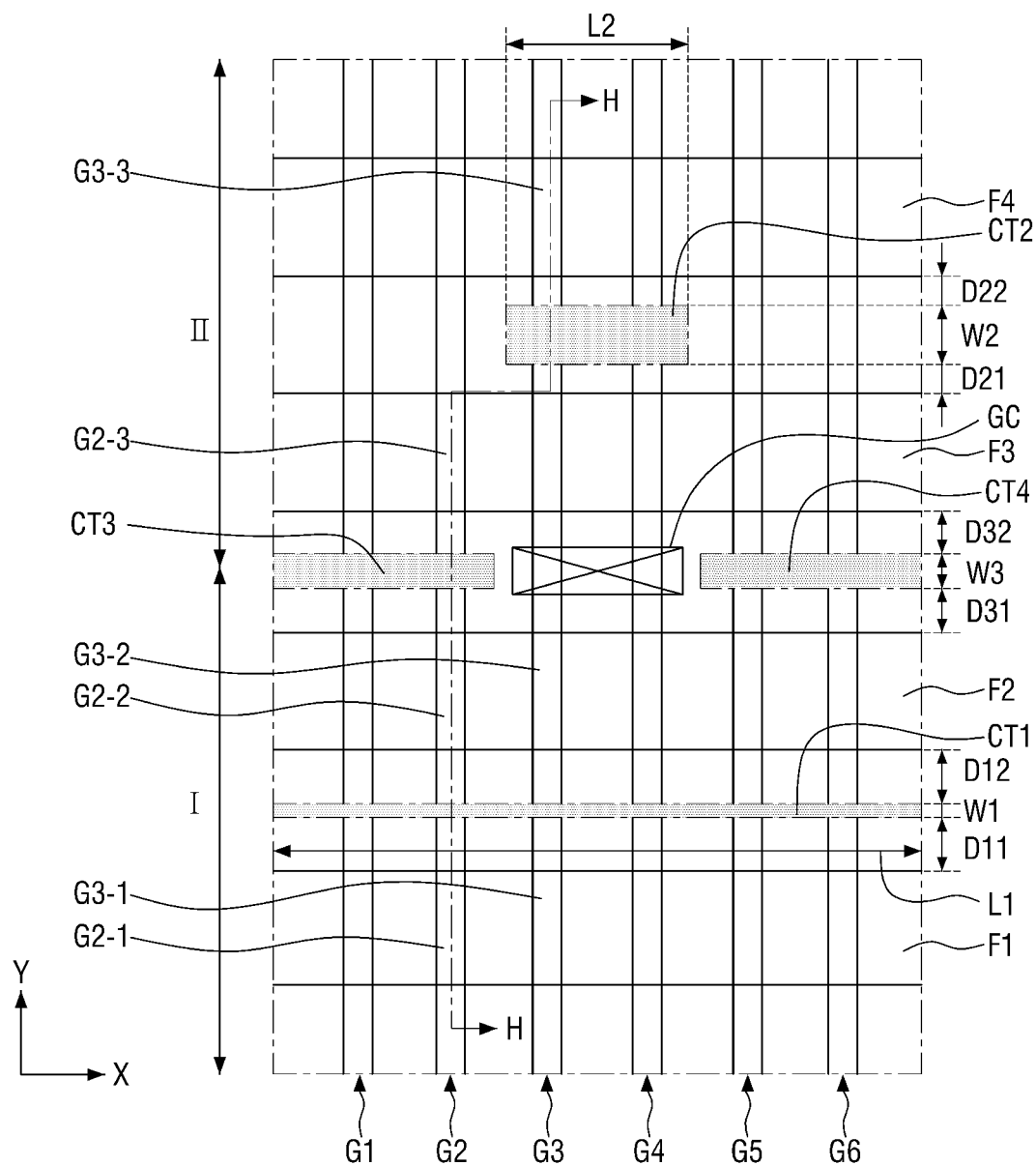
FIGS. 18A to 18B are views provided to explain a semiconductor device according to another exemplary embodiment.
Figure 18B:
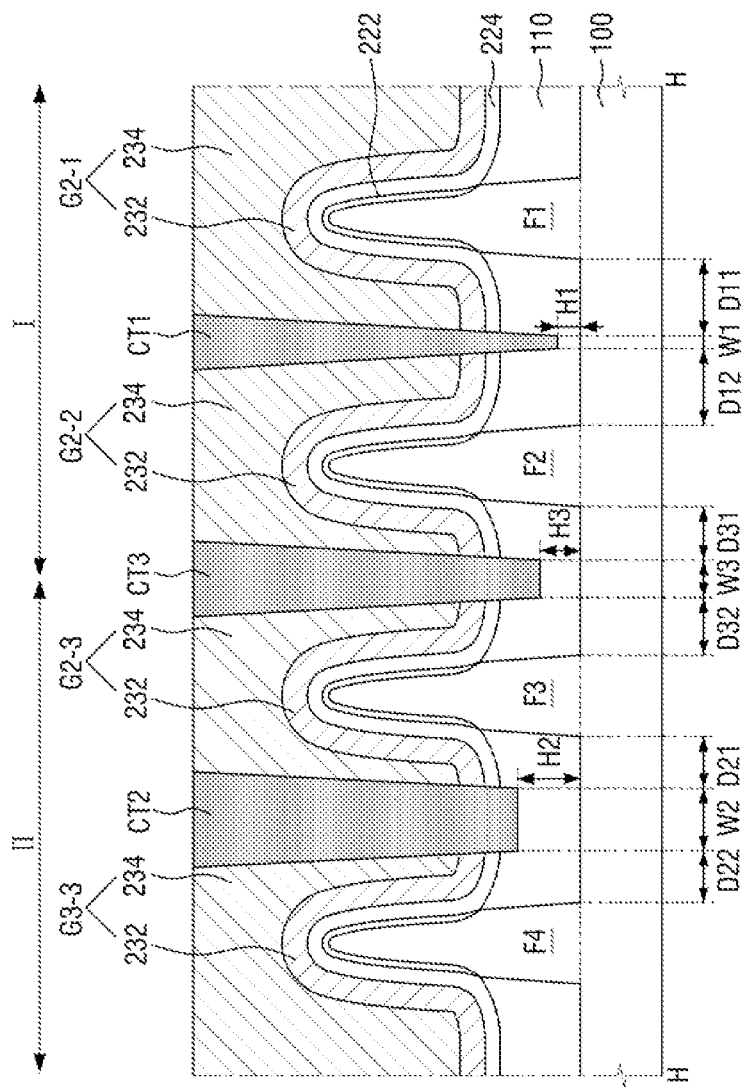
Figure 19A:
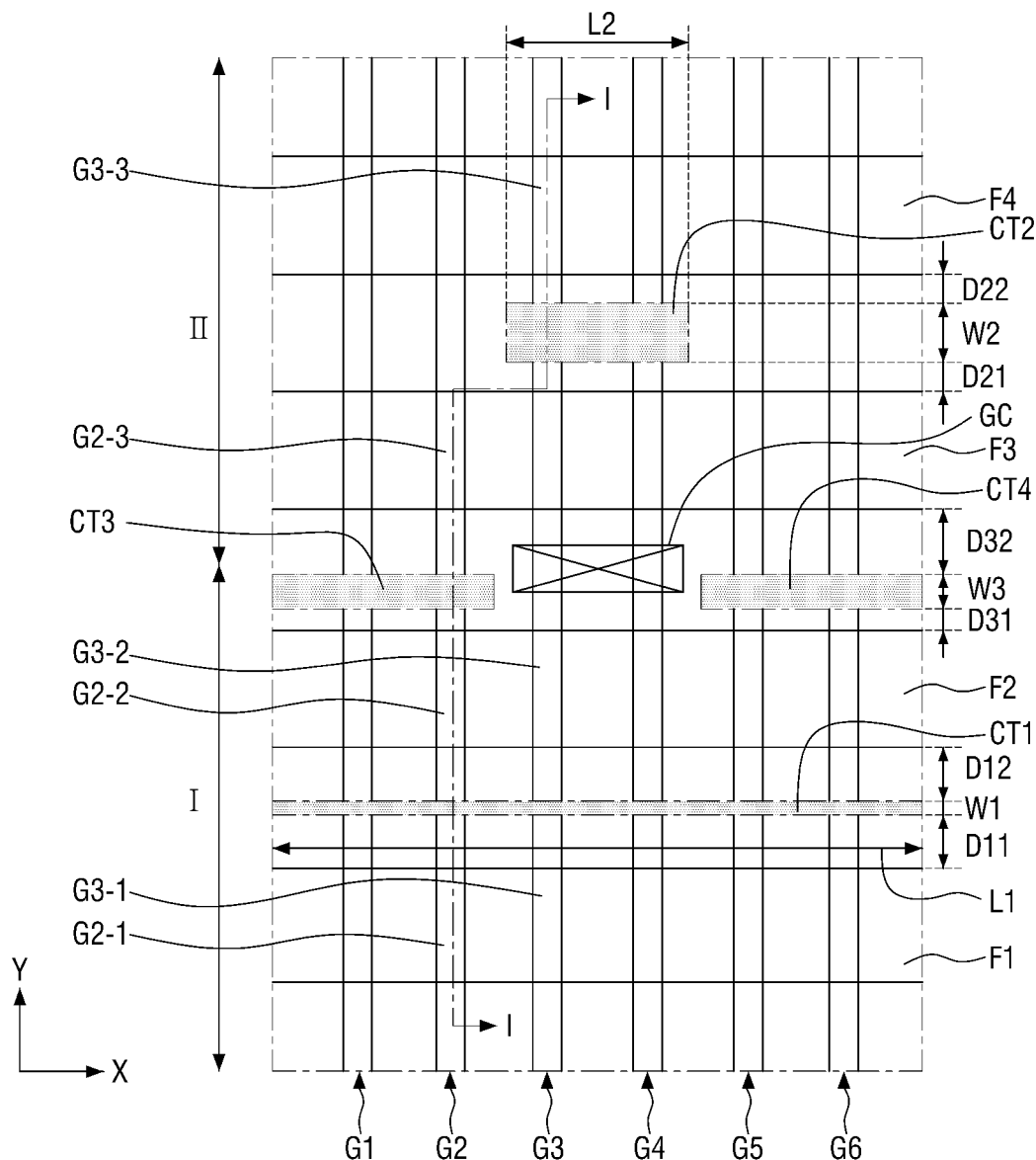
FIGS. 19A to 19B are views provided to explain a semiconductor device according to another exemplary embodiment.
Figure 19B:
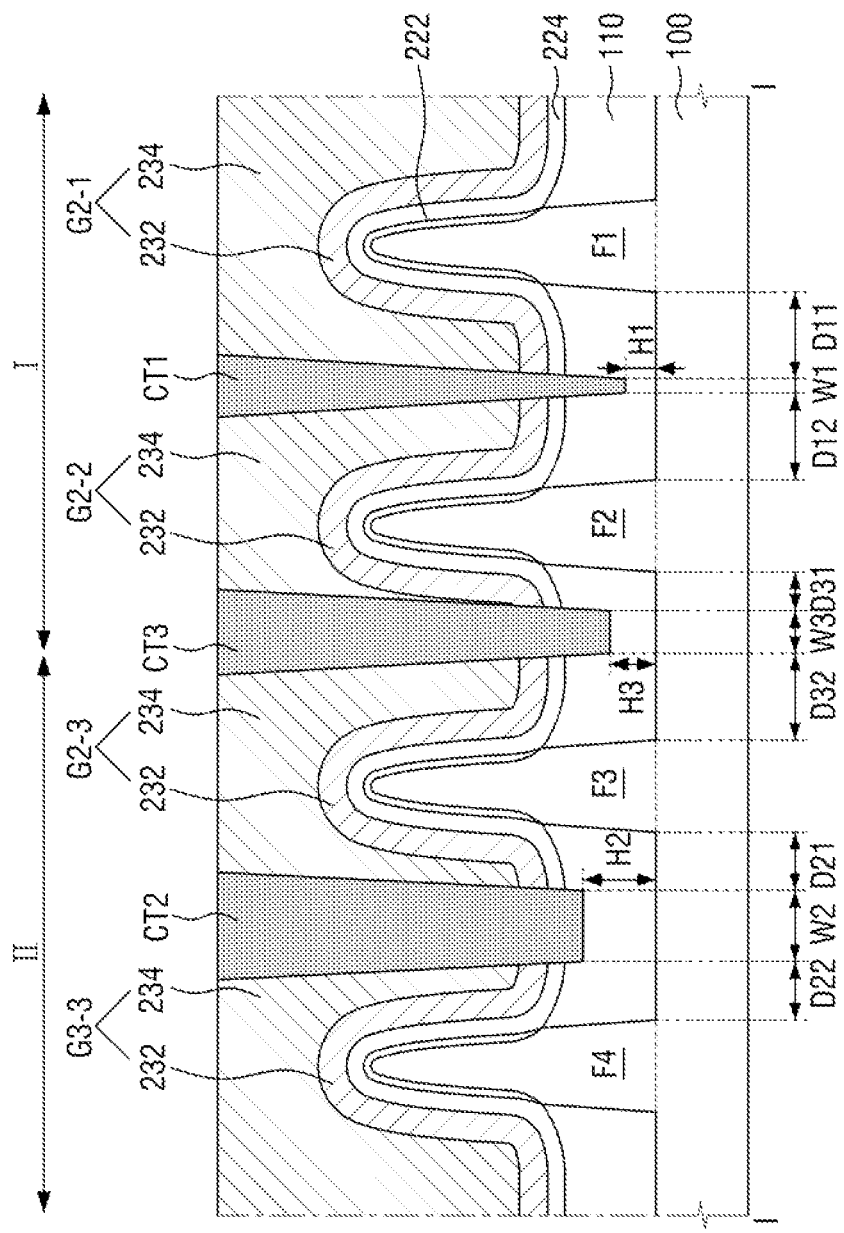

FIGS. FIGS. 17A to 17B, FIGS. 18A to 18B, FIGS. 19A to 19B are views provided to explain a semiconductor device according to some exemplary embodiments. For reference, FIG. 17B is a cross-sectional view taken on G-G of FIG. 17A. FIGS. 18B and 19B are cross-sectional views taken on H-H and I-I of FIGS. 18A and 19A, respectively.

Referring to FIGS. 17A and 17B, in the semiconductor device according to some exemplary embodiments, the width W2 of the second cut region CT2 may be different from the width W1 of the first cut region CT1, and the length L2 of the second cut region CT2 may be different from the length L1 of the first cut region CT1.

For example, the width W2 of the second cut region CT2 may be larger than the width W1 of the first cut region CT1. In addition, for example, the length L2 of the second cut region CT2 extended in the first direction X may be shorter than the length L1 of the first cut region CT1 extended in the first direction X.

In this case, as described above in the explanation of FIGS. 7B and 14B, the drain current $I_D$ of the transistor including the third active pattern F3 and the third gate electrode G3 may increase. In addition, the drain current $I_D$ of the transistor including the second active pattern F2 and the third gate electrode G3 may be prevented from decreasing. Accordingly, the semiconductor device with further improved operation performance may be provided.

In some exemplary embodiments, the first cut region CT1 and the second cut region CT2 may have depths different from each other. For example, as shown in FIG. 17B, the height H1 of the bottom surface of the first cut region CT1 from the top surface of the substrate 100 may be different from the height H2 of the bottom surface of the second cut region CT2. For example, the height H1 of the bottom surface of the first cut region CT1 may be lower than the height H2 of the bottom surface of the second cut region CT2.

Referring to FIGS. 18A and 18B, the semiconductor device according to some exemplary embodiments further includes the third and fourth cut regions CT3, CT4.

In this case, operation performance of the transistor including the second active pattern F2, which is the NFET region, can be enhanced. For example, as described above in the explanation of FIGS. 5A and 5B, when the third cut region CT3 is positioned, the drain current $I_D$ of the transistor including the third gate electrode G3 and the second active pattern F2 may increase. Accordingly, the semiconductor device with further enhanced operation performance of the NFET may be provided.

In some exemplary embodiments, the first cut region CT1, the second cut region CT2, and the third cut region CT3 may have depths different from one another. For example, as shown in FIG. 18B, the height H3 of the bottom surface of the third cut region CT3 from the top surface of the substrate 100 may be different from the height H1 of the bottom surface of the first cut region CT1 and the height H2 of the bottom surface of the second cut region CT2. For example, the height H3 of the bottom surface of the third cut region CT3 may be higher than the height H1 of the bottom surface of the first cut region CT1, and may be lower than the height H2 of the bottom surface of the second cut region CT2.

Referring to FIGS. 19A and 19B, in the semiconductor device according to some exemplary embodiments, the distance D31 between the second active pattern F2 and the third and fourth cut regions CT3, CT4 may be different from the distance D32 between the third active pattern F3 and the third and fourth cut regions CT3, CT4.

For example, the distance D31 between the second active pattern F2 and the third and fourth cut region CT3, CT4 may be shorter than the distance D32 between the third active pattern F3 and the third and fourth cut regions CT3, CT4.

In this case, as described above in the explanation of FIGS. 5B, the drain current $I_D$ of the transistor including the second active pattern F2 and the third gate electrode G3 may increase. In addition, the drain current $I_D$ of the transistor including the third active pattern F3 and the third gate electrode G3 may be prevented from decreasing. Accordingly, the semiconductor device with further improved operation performance may be provided.

According to an exemplary embodiment, a semiconductor device is provided, in which, first to fourth active patterns extend in parallel in a first direction, and are arranged along a second direction intersecting the first direction, a first gate electrode is provided on the first to fourth active patterns and extending in the second direction, a first cut region extends in the first direction between the first active pattern and the second active pattern to cut the first gate electrode and a second cut region extends in the first direction between the third active pattern and the fourth active pattern to cut the first gate electrode, where one or more first dimensional features related to the first cut region is different from one or more second dimensional features related to the second cut region.

According to another exemplary embodiment, a semiconductor device is provided. The semiconductor device includes first to third active patterns that extend in parallel in a first direction, and are arranged along a second direction intersecting the first direction, a first gate electrode provided on the first to third active patterns and extending in the second direction, a second gate electrode extended in the second direction adjacent to the first gate electrode on the first to third active patterns, a first cut region that extends in the first direction between the first active pattern and the second active pattern to cut the first gate electrode and a second cut region that extends in the first direction between the second active pattern and the third active pattern to cut the second gate electrode, and not to cut the first gate electrode, where one or more first dimensional features related to the first cut region is different from one or more second dimensional features related to the second cut region.

According to another exemplary embodiment, a semiconductor device is provided. The a semiconductor device includes a substrate comprising an NFET region and a PFET region, a first active pattern provided on the NFET region and extending in a first direction, a second active pattern provided on the PFET region and extending in the first direction, a first gate electrode provided on the first and second active patterns and extending in a second direction intersecting the first direction, a first cut region provided on a first side surface of the first active pattern opposite to the second active pattern and extending in the first direction to cut the first gate electrode and a second cut region provided on a second side surface of the second active pattern opposite to the first active pattern and extending in the first direction to cut the first gate electrode, where one or more first dimensional features related to the first cut region is different from one or more second dimensional features related to the second cut region.

Those skilled in the art will appreciate that many variations and modifications may be made to the exemplary embodiments without substantially departing from the principles of the disclosure. Therefore, the exemplary embodiments of the disclosure are used in a generic and descriptive sense only and not for purposes of limitation.

What is claimed is:

1. A semiconductor device comprising:
   a first active pattern, a second active pattern, a third active pattern, and a fourth active pattern, all of which extend in parallel in a first direction, and are arranged along a second direction intersecting the first direction;
   a field insulating film covering a part of side surfaces of the first to fourth active patterns;
   a gate electrode provided on the first to fourth active patterns and extending in the second direction;
   a gate dielectric film interposed between the first to fourth active patterns and the gate electrode, and between the field insulating film and the gate electrode;
   a first cut region that extends from a top surface of the gate electrode into the field insulating film between the first active pattern and the second active pattern to cut the gate electrode and the gate dielectric film; and
   a second cut region that extends from the top surface of the gate electrode into the field insulating film between the third active pattern and the fourth active pattern to cut the gate electrode and the gate dielectric film,
   wherein a first width of the first cut region in the second direction at the top surface of the gate electrode is different from a second width of the second cut region in the second direction at the top surface of the gate electrode, wherein a first length of the first cut region from a bottom surface of the first cut region to the top surface of the gate electrode is different from a second length of the second cut region from a bottom surface of the second cut region to the top surface of the gate electrode, and wherein the first length of the first cut region and the second length of the second cut region are longer than a third length from a top surface of the field insulating film to the top surface of the gate electrode.

2. The semiconductor device of claim 1, wherein the first width of the first cut region in the second direction at the top surface of the gate electrode is shorter than the second width of the second cut region in the second direction at the top surface of the gate electrode, and wherein the first length of the first cut region from the top surface of the gate electrode is higher than the second length of the second cut region from the top surface of the gate electrode.

3. The semiconductor device of claim 1, wherein the first cut region and the second cut region comprise at least one of silicon nitride, silicon oxynitride, silicon oxide, or silicon oxy carbonitride.

4. The semiconductor device of claim 1, wherein the first cut region extends in the first direction between the first active pattern and the second active pattern, wherein the second cut region extends in the first direction between the third active pattern and the fourth active pattern, and wherein the first length of the first cut region extended in the first direction is different from the second length of the second cut region extended in the first direction.

5. The semiconductor device of claim 4, wherein the first and second active patterns correspond to an N-Channel Field Effect Transistor (NFET) region, and the third and fourth active patterns correspond to a P-Channel Field Effect Transistor (PFET) region, and wherein the length of the first cut region extended in the first direction is longer than the second length of the second cut region extended in the first direction.

6. The semiconductor device of claim 1, wherein the first cut region extends in the first direction between the first active pattern and the second active Pattern, wherein the second cut region extends in the first direction between the third active pattern and the fourth active pattern, and wherein the first and second active patterns correspond to an N-Channel Field Effect Transistor (NFET) region, and the third and fourth active patterns correspond to a P-Channel Field Effect Transistor (PFET) region.

7. The semiconductor device of claim 1, wherein the first and second active patterns correspond to an N-Channel Field Effect Transistor (NFET) region, and the third and fourth active patterns correspond to a P-Channel Field Effect Transistor (PFET) region, and wherein a first distance between the second active pattern and the first cut region is longer than a second distance between the third active pattern and the second cut region.

8. The semiconductor device of claim 1, wherein a distance between the first active pattern and the first cut region is same as a distance between the first cut region and the second active pattern, and wherein a distance between the third active pattern and the second cut region is same as a distance between the second cut region and the fourth active pattern.

9. The semiconductor device of claim 1, wherein the gate electrode comprises a work function adjustment film extending along the gate dielectric film and a filling conductive film on the work function adjustment film.

10. The semiconductor device of claim 1, wherein the gate dielectric film is not extended along a side surface of the first cut region and a side surface of the second cut region.

11. A semiconductor device comprising:

a first active pattern, a second active pattern, a third active pattern, and a fourth active pattern, all of which extend in parallel in a first direction, and are arranged along a second direction intersecting the first direction;

a field insulating film surrounding a part of side surfaces of the first to fourth active pattern, a first gate electrode provided on the first to fourth active patterns and extending in the second direction;

a first gate dielectric film interposed between the first to fourth active patterns and the first gate electrode, and between the field insulating film and the first gate electrode;

a first cut region that extends in the first direction between the first active pattern and the second active pattern to cut the first gate electrode and the first gate dielectric film;

a second cut region that extends in the first direction between the third active pattern and the fourth active pattern to cut the first gate electrode and the first gate dielectric film; and a third cut region that extends in the first direction between the second active pattern and the third active pattern to cut the first gate electrode and the first gate dielectric film, wherein a first width of the first cut region in the second direction at the top surface of the first gate electrode, a second width of the second cut region in the second direction at the top surface of the first gate electrode, and a third width of the third cut region in the second direction at the top surface of the first gate electrode are different from each other, wherein a first length of the first cut region from a bottom surface of the first cut region to the top surface of the first gate electrode, a second length of the second cut region from a bottom surface of the second cut region to the top surface of the first gate electrode, and a third length of the third cut region from a bottom surface of the third cut region to the top surface of the first gate electrode are different from each other, and wherein the first length of the first cut region, the second length of the second cut region, and the third length of the third cut region are higher than a fourth length from a top surface of the field insulating film to the top surface of the first gate electrode.

12. The semiconductor device of claim 11, wherein the third width of the third cut region in the second direction at the top surface of the first gate electrode is larger than the first width of the first cut region in the second direction at the top surface of the first gate electrode and is shorter than the second width of the second cut region in the second direction at the top surface of the first gate electrode, and wherein the third length of the third cut region from the top surface of the first gate electrode is lower than the first length of the first cut region from the top surface of the first gate electrode and is higher than the second length of the second cut region from the top surface of the first gate electrode.

13. The semiconductor device of claim 11, wherein further comprising:
   a second gate electrode extended in the second direction adjacent to the first gate electrode on the first to fourth active patterns; and
   a second gate dielectric film interposed between the first to fourth active patterns and the second gate electrode, and between the field insulating film and the second gate electrode,
   wherein the first cut region and the second cut region cut the second gate electrode and the second gate dielectric film.

14. The semiconductor device of claim 11, wherein a first distance between the second active pattern and the third cut region is different from a second distance between the third active pattern and the third cut region.

15. The semiconductor device of claim 14, wherein the first and second active patterns correspond to an N-Channel Field Effect Transistor (NFET) region, and the third and fourth active patterns correspond to a P-Channel Field Effect Transistor (PFET) region, and
   wherein a first distance between the second active pattern and the third cut region is different from a second distance between the third active pattern and the third cut region.

16. The semiconductor device of claim 15, wherein the first and second active patterns correspond to an N-Channel Field Effect Transistor (NFET) region, and the third and fourth active patterns correspond to a P-Channel Field Effect Transistor (PFET) region, and
   wherein a first distance between the second active pattern and the third cut region is shorter from a second distance between the third active pattern and the third cut region.

17. The semiconductor device of claim 14, wherein the first cut region, the second cut region and the third cut region include at least one of silicon nitride, silicon oxynitride, silicon oxide, or silicon oxy carbonitride.

18. A semiconductor device, comprising:
   a first active pattern extending in a first direction;
   a second active pattern extending in the first direction;
   a field insulating film surrounding a part of side surfaces of the first and second active patterns on the substrate;
   a first gate electrode provided on the first and second active patterns and extending in a second direction intersecting the first direction;
   a first cut region provided on a first side surface of the first active pattern opposite to the second active pattern and extending in the first direction to cut the gate electrode; and
   a second cut region provided on a second side surface of the second active pattern opposite to the first active pattern and extending in the first direction to cut the gate electrode,
   wherein the first and second active patterns protrude upwardly above the field insulating film,
   wherein a first width of the first cut region in the second direction at a top surface of the first gate electrode is different from a second width of the second cut region in the second direction at the top surface of the first gate electrode,
   wherein a first length of the first cut region from a bottom surface of the first cut region to the top surface of the first gate electrode is different from a second length of the second cut region from a bottom surface of the second cut region to the top surface of the first gate electrode, and
   wherein the first length of the first cut region and the second length of the second cut are higher than a third length from a top surface of the field insulating film to the top surface of the first gate electrode.

19. The semiconductor device of claim 18, further comprising:
   a second gate electrode provided on the first and second active patterns and extending in the second direction adjacent to the first gate electrode; and
   a third cut region that extends in the first direction between the first active pattern and the second active pattern to cut the second gate electrode, and not to cut the first gate electrode.

20. The semiconductor of claim 19, wherein a top surface of the second gate electrode is on a same plane as the top surface of the first gate electrode,
   wherein a third width of the third cut region in the second direction at the top surface of the second gate electrode is different from the first width of the first cut region in the second direction at the top surface of the first gate electrode and the second width of the second cut region in the second direction at the top surface of the first gate electrode,
   wherein a fourth length of the third cut region from the bottom surface of the third cut region to the top surface of the second gate electrode is different from the first length of the first cut region and the second length of the second cut region, and
   wherein the fourth length of the third cut region is higher than the third length from the top surface of the field insulating film to the top surface of the first gate electrode.

* * * * *